United States Patent
Aweya et al.

(10) Patent No.: US 7,590,210 B2
(45) Date of Patent: Sep. 15, 2009

(54) METHOD AND APPARATUS FOR SYNCHRONIZING INTERNAL STATE OF FREQUENCY GENERATORS ON A COMMUNICATIONS NETWORK

(75) Inventors: James Aweya, Kanata (CA); Delfin Y. Montuno, Kanata (CA); Michel Ouellette, Orleans (CA); Kent Felske, Kanata (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 566 days.

(21) Appl. No.: 11/172,100

(22) Filed: Jun. 30, 2005

(65) Prior Publication Data

US 2006/0056560 A1  Mar. 16, 2006

Related U.S. Application Data

(60) Provisional application No. 60/609,477, filed on Sep. 13, 2004, provisional application No. 60/630,550, filed on Nov. 23, 2004, provisional application No. 60/609,478, filed on Sep. 13, 2004, provisional application No. 60/674,231, filed on Apr. 23, 2005.

(51) Int. Cl.
  H04L 7/00 (2006.01)
  H04J 3/06 (2006.01)
(52) U.S. Cl. .................. 375/356; 370/503
(58) Field of Classification Search ......... 375/355–356, 375/371, 376; 370/503, 506
See application file for complete search history.

(56) References Cited

U.S. PATENT DOCUMENTS 5,528,638 A * 6/1996 Rajivan .............. 375/376

6,028,488 A 2/2000 Landman et al.
6,275,549 B1 * 8/2001 Greatwood et al. ......... 375/356
6,574,225 B2 6/2003 Reynolds et al.

(Continued)

FOREIGN PATENT DOCUMENTS

EP  1 294 116 A2  3/2003

(Continued)

OTHER PUBLICATIONS

International Search Report dated Jan. 3, 2006, from corresponding PCT patent application No. PCT/CA2006/001390.

*Primary Examiner*—Khanh C Tran
(74) *Attorney, Agent, or Firm*—Anderson Gorecki & Manaras LLP

(57) ABSTRACT

A first level of control over operation of slave Digitally Controlled Frequency Selectors (DCFSs), such as DCOs or DDSs, may occur by periodic transmission of control words from the master clock to the slave clocks. To allow enhanced control over the output of the slave clocks, the frequency of the local oscillator used to generate the synthesized output of the master clock may also be conveyed to the slave clocks to allow a second level of control to take place. The second level of control allows the local oscillators at the slave clocks to lock onto the frequency of the master local oscillator to thereby allow the slave local oscillators to operate the slave DCFSs using the same local oscillator frequency. The first level of control synchronizes operation of the DCFSs while the second level control prevents instabilities in the local oscillators from causing long term drift between the slave and master clock outputs. Timestamps may be used to synchronize the master and slave local oscillators.

9 Claims, 14 Drawing Sheets

U.S. PATENT DOCUMENTS

| | | |
|---|---|---|
| 7,039,380 B2 * | 5/2006 | Jahene et al. ............... 455/260 |
| 7,251,199 B2 * | 7/2007 | Eidson ........................ 368/46 |
| 7,372,875 B2 * | 5/2008 | Hadzic et al. ............... 370/516 |
| 2003/0128720 A1 * | 7/2003 | Jones ........................ 370/516 |
| 2003/0133522 A1 * | 7/2003 | Staszewski et al. ......... 375/345 |
| 2004/0120395 A1 * | 6/2004 | Orr et al. ..................... 375/237 |
| 2004/0176045 A1 * | 9/2004 | Lillie .......................... 455/76 |

FOREIGN PATENT DOCUMENTS

| | | |
|---|---|---|
| WO | WO 2004/075445 A1 | 9/2004 |

\* cited by examiner $f_{ref} > f_T$

Maximum value of UP/DOWN Counter is
*Max*

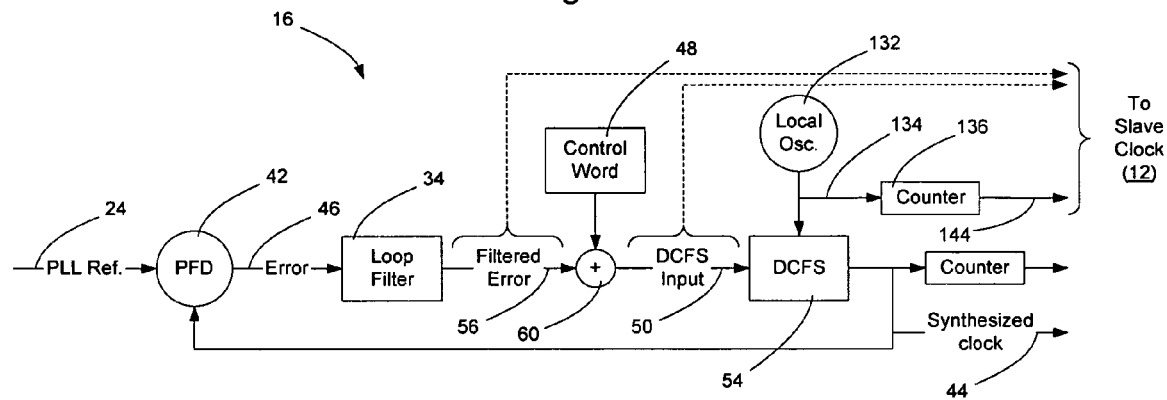
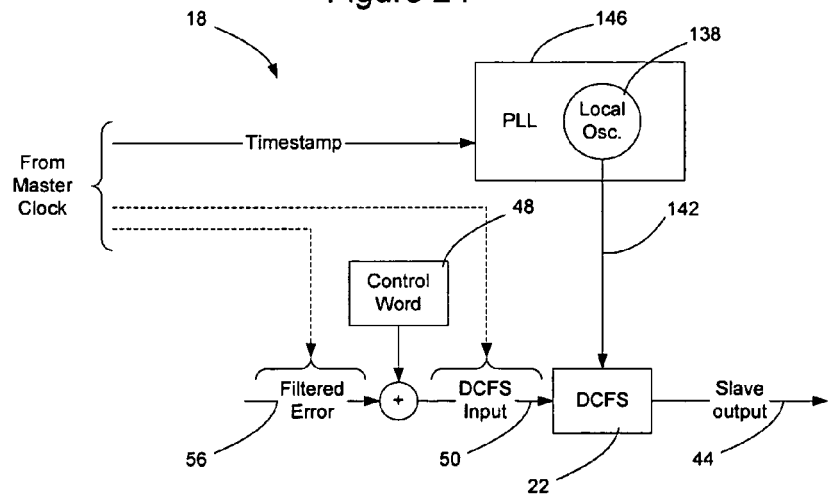

METHOD AND APPARATUS FOR SYNCHRONIZING INTERNAL STATE OF FREQUENCY GENERATORS ON A COMMUNICATIONS NETWORK

CROSS REFERENCE TO RELATED APPLICATIONS

This application is related to and claims the benefit of U.S. Provisional Application No. 60/609,477, filed Sep. 13, 2004; U.S. Provisional Application No. 60/609,478, filed Sep. 13, 2004; U.S. Provisional application No. 60/630,550, filed Nov. 23, 2004; and U.S. Provisional Application No. 60/674,231, filed Apr. 23, 2004, and is also related to U.S. Patent Application entitled Method And Apparatus For Synchronizing Clock Timing Between Network Elements, filed on even date herewith. The content of each of these provisional and utility applications is hereby incorporated herein by reference.

BACKGROUND OF THE INVENTION

1. Field of the Invention

The present invention relates to communication networks and, more particularly, to a method and apparatus for synchronizing the internal state of frequency generators on a communications network.

2. Description of the Related Art

Data communication networks may include various computers, servers, nodes, routers, switches, hubs, proxies, and other devices coupled to and configured to pass data to one another. These devices will be referred to herein as "network elements." Data is communicated through the data communication network by passing data over an established circuit or by packetizing the data and routing the data packets between a series of network elements over the network.

There are two basic types of networks—Time Division Multiplexed (TDM) networks and packet networks. These two networks differ in how signals are separated on the physical medium. In a TDM network, the network elements rely on time to determine which signals belong to which connection, whereas in a packet network the packets are individually addressed in a manner that is able to be understood by the network elements. Since TDM networks rely on time to divide signals between multiple logical channels, timing requirements of TDM networks are relatively stringent. In a packet network, by contrast, timing is less important since each packet of data is self-contained and is able to specify to the network its size and other associated parameters. Since timing is not as important on a packet network, the network elements on a packet network are generally not synchronized. Hence, packet networks are generally implemented as asynchronous networks.

TDM networks are synchronous in nature. Consequently, the equipment connected to a TDM network has to be synchronized to it in some manner. In a TDM network, a timing distribution network typically will link the TDM nodes to provide a synchronization signal that is traceable to a Primary Reference Source (PRS). Networking synchronization is derived from the PRS and distributed through a hierarchy of network nodes with lesser stratum clocks. An alternative timing solution is to maintain a distributed PRS architecture, where for example, each TDM node is timed from an accurate timing source, such as a PRS/Stratum 1 clock, Global Positioning System (GPS) based clock, or a standalone accurate clock (e.g., H Maser, Cesium, Rubidium, etc.). The particular timing requirements on a service interface depend on the services (T1, E1, T3, E3, etc.) carried over the network, which are typically specified in a standard promulgated for that particular service type.

Timing signals in a synchronous network are used by the physical interfaces of the network elements to put data on the transmission media, and to extract data from the media. In other words, clocking at the physical interface of a network element controls the speed at which data is transmitted on the physical connection. Typically, to accommodate minor transmission jitter, a de-jittering or elastic buffer is implemented at the receiver. The arrival rate and the departure rate from the buffer are controlled, respectively, by the transmitter clock and the receiver clock. If the physical interfaces on a connection are not synchronized (not driven by a clocking signal of identical frequency), data can be lost due to buffer overflow or underflow, resulting in periodic line errors.

As packet technology has increased in reliability and sophistication, the cost of deploying packet-based networks such as Ethernet networks and Internet Protocol (IP) networks has dropped to the point where it is often cheaper to deploy a packet network than to deploy a TDM network. To take advantage of the lower costs of packet network technology, service providers have sought to implement a packet-based core network intermediate existing TDM networks. To allow a packet network to carry TDM traffic, the packet network must essentially behave as a transparent "link" in the end-to-end connection. The transparent inclusion of a packet network in an end-to-end path of a connection that carries circuit-switched time sensitive traffic is commonly referred to as "circuit emulation" on the packet network.

The non-synchronous nature of the packet network and the packetizing and depacketizing processes used to format the data for transmission over the packet network all contribute to increased jitter and delay in the transmission of traffic, which makes synchronization of the different TDM networks and network elements on these TDM networks difficult. Additionally, while packet networks are able to carry traffic between the end TDM networks, they do not naturally carry clock information due to their asynchronous nature. Thus, to enable TDM traffic to be carried over a packet network, it is necessary to have the end systems directly exchange clock information to allow the data ports on the network elements to be synchronized and to allow the different networks to be synchronized.

To overcome the inherent non-synchronous nature of a packet network, a network element or a downstream terminal mode may use an adaptive timing technique to reconstruct the timing signal of the upstream TDM terminal. In an adaptive clocking technique, the TDM receiver derives an estimate of the transmitter clock from the received data stream. This is commonly done using a phase-locked loop (PLL) that slaves the receiver clock to a transmitter clock. The slave PLL is able to process transmitted clock samples encoded within the data stream, or process data arrival patterns, to generate timing signals for the receiver. The purpose of the slave PLL is to estimate and compensate for the frequency drift occurring between the oscillators of the transmitter clock and the receiver clock.

Several adaptive timing techniques have been developed, including extracting clock information from arrival patterns over the network, observing the rate at which the buffers are being filled, and using encoded timing signals transmitted from the upstream terminal to the downstream terminal across the packet network. One example of the use of encode timing signals (timestamps) is described in U.S. patent application Ser. No. 10/076,415, entitled "Technique for Synchronizing Clocks in a Network", the content of which is hereby incorporated by reference. Although several of the developed techniques are relatively good at transmitting clock signals on the network, it would still be advantageous to find a way to transmit better clock information across the network, and to find a way to use a less complicated circuit than a PLL to implement the slave clocks.

SUMMARY OF THE INVENTION

The present invention overcomes these and other drawbacks by providing a method and apparatus for synchronizing network elements. According to an embodiment of the invention, a master clock is implemented as an all digital phase locked loop. The loop filter output is used to control a Digitally Controlled Frequency Selector (DCFS). The output of the loop filter is also sampled and periodically transmitted to slave clocks to allow the slave clocks to emulate the state of the master clock. The slave clocks, in this embodiment, use the transmitted information as an input to directly control their output frequency to match the output frequency of the master DCFS. The DCFS may be implemented as a digitally controlled oscillator (DCO) or as a Direct Digital Synthesizer (DDS).

Where the master clock is implemented using a DCO as the DCFS, the slave clocks will also be implemented using DCOs. In the master clock, error signals are generated by a Phase Frequency Detector (PFD) and then processed by a loop filter to form a filtered error signal that is combined with a nominal control word to form a DCO control word. The DCO control word is in turn used to control the local DCO and the remote DCOs. Where the master clock is implemented using a DDS as the DCFS, the slave clocks will also be implemented using DDSs. The control word that is used to set the frequency of the master DDS is also transmitted to the slave DDSs, and used by the slave DDSs to cause the slave DDSs to generate the same frequency as the master DDS.

According to another embodiment of the invention, to ensure that the local oscillators in the slave DCFSs are oscillating at the same frequency as the master local oscillator, the slave local oscillators are formed as voltage controlled oscillators and a feedback loop is used to synchronize the slave local oscillators with the master local oscillator. In one embodiment, time stamps are used to transmit state information from the master local oscillator to the slave local oscillators so that the slave local oscillators may replicate the frequency of the master local oscillator to eliminate any long term drift of the slave local oscillator relative to the master local oscillator.

BRIEF DESCRIPTION OF THE DRAWINGS

Aspects of the present invention are pointed out with particularity in the appended claims. The present invention is illustrated by way of example in the following drawings in which like references indicate similar elements. The following drawings disclose various embodiments of the present invention for purposes of illustration only and are not intended to limit the scope of the invention. For purposes of clarity, not every component may be labeled in every figure. In the figures:

FIG. 23 is a functional block diagram of a master clock configured to provide information associated with operation of a local oscillator forming part of a DCFS to the slave clocks according to an embodiment of the invention;

FIG. 24 is a functional block diagram of a slave clock configured to allow second level control over the local oscillator according to an embodiment of the invention;

DETAILED DESCRIPTION

The following detailed description sets forth numerous specific details to provide a thorough understanding of the invention. However, those skilled in the art will appreciate that the invention may be practiced without these specific details. In other instances, well-known methods, procedures, components, protocols, algorithms, and circuits have not been described in detail so as not to obscure the invention.

First Level Control—Exchange of Control Words

Figure 1:
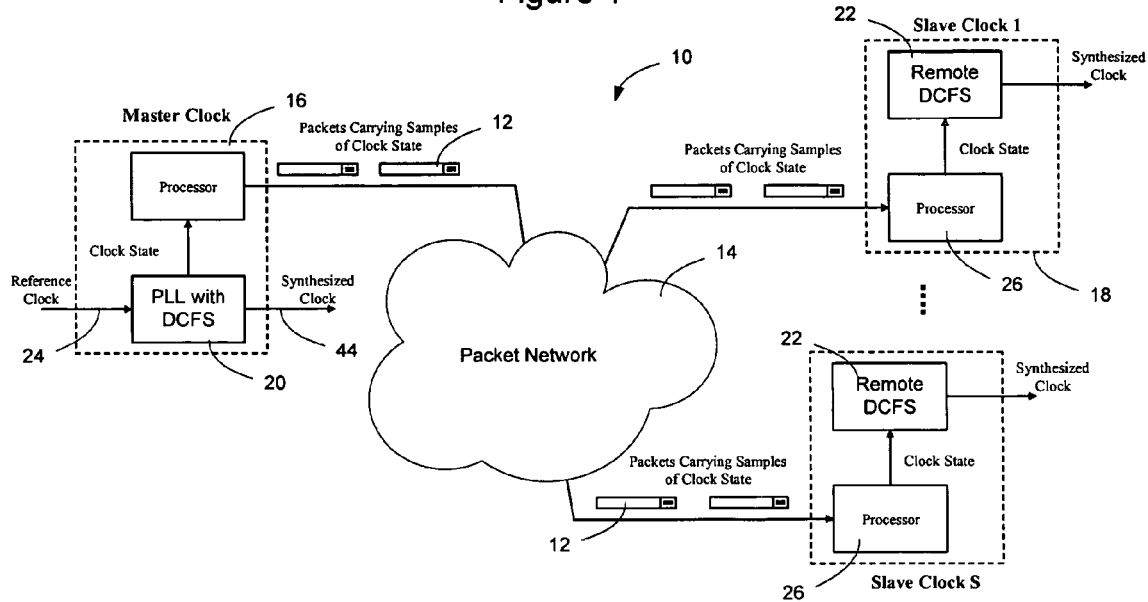
FIG. 1 is a functional block diagram of an example communication network over which clock synchronization may take place according to an embodiment of the invention.

FIG. 1 illustrates an example network 10 in which clock information 12 is carried across a packet network 14 from a master clock 16 to one or more slave clocks 18. As shown in FIG. 1, synchronization of the master and slave clocks is achieved over a packet (non TDM) portion of the network 10 by transmitting packets 12 containing clock state information from the master clock 16 to the slave clocks 18. The master clock 16, according to embodiments of the invention, includes an all digital phase locked loop including a Digitally Controlled Frequency Selector (DCFS) such as a Digitally Controlled Oscillator (DCO) or Direct Digital Synthesizer (DDS) as discussed in greater detail below. The slave clocks 18, in this embodiment, are formed to include the same type of DCFS as the master clock 16 rather than as PLLs. For example, where the master clock uses a DCO to select a frequency the slave clocks would be formed as DCOs, and where the master clock uses a DDS to select a frequency the slave clocks would be formed as DDSs.

In operation, the master clock PLL locks onto an external reference clock 24 by adjusting a control word input to the DCFS. The control word that is used by the master DCFS is transmitted via packets 12 across the network 10 to the slave clocks 18. The slave clocks extract the control word via processor 26 and use that as the new input to the slave DCFS 22. In this way, the same control word that has been derived from the master clock DCFS may be used to replicate the output frequency in the DCFSs forming the slave clocks. By periodically transmitting the control words from the master clock to the slave clocks, the slave clocks can be made to track operation of the master without requiring the slave clocks to be implemented as phase locked loops.

Figure 2:
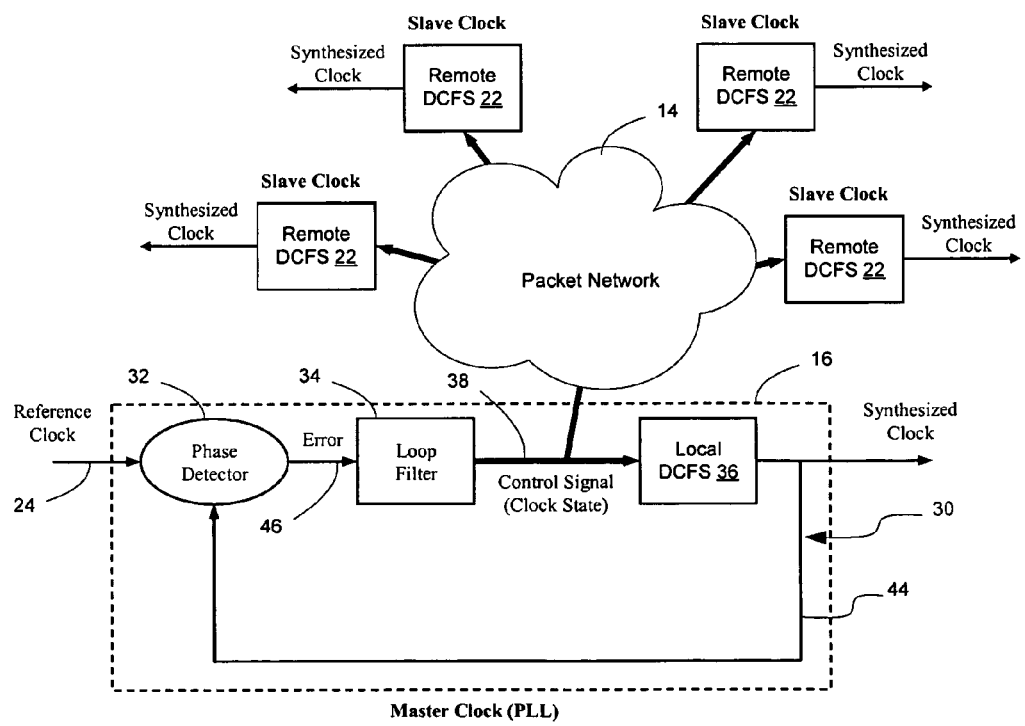
FIG. 2 is a functional block diagram of another example communication network over which clock synchronization may take place according to an embodiment of the invention.

FIG. 2 illustrates another view of the network of FIG. 1. As shown in FIG. 2, the master clock 16 includes a PLL 30 having a phase detector 32, a loop filter 34, and a local DCFS 36. The clock control word 38, that is input to the master DCFS 36 to set the frequency of the master DCFS to lock onto the reference clock 24 is transmitted to the slave DCFSs 22 to allow the slave DCFSs 22 to mimic operation of the master clock DCFS 36. Since the frequency of a DCFS may be directly controlled by adjusting the control word 38, using the same control word at the slave DCFSs will cause the slave clocks 18 to generate the same frequency as the master clock 16 without requiring the slave clocks 16 to be implemented as PLLs.

Communication between the master clock and the slave clocks over the packet network can be done in-band, for example by transmitting clock state samples with or without user data, or out-of-band, for example by using a separate physical or logical communication channel, for example, using Real Time Control Protocol (RTCP). The invention is not limited to the particular manner in which the DCFS control word is transmitted from the master clock 16 to the slave clocks 18 or the particular protocols or other technologies involved in the transportation of the control word from the master clock to the slave clocks. Additionally, although only one master and a plurality of slaves have been shown, in a practical embodiment multiple network elements would take place in the clock synchronization scheme, and the invention is not limited to the example network architectures shown in FIGS. 1 and 2.

Two examples of a DCFS that may be used in connection with embodiments of the invention will be described in greater detail below. The first example will describe an embodiment in which the DCFS is formed as a digitally controlled oscillator (DCO), and the second example will describe an embodiment in which the DCFS is formed as a Direct Digital Synthesizer (DDS). The invention is not limited to these two particular structures as other types of digitally controlled frequency selectors may also be used to enable synchronization between the master and slave clocks to occur by transmission of a control word to specify an operating frequency of the slave clocks.

Master Clock

A Phase Locked Loop (PLL) is one of the basic building blocks commonly used in frequency synthesis. A PLL can be constructed using analog technology, using a combination of analog and digital technology, and using only digital technology. As used herein, the term all-digital PLL (ADPLL) will be used to describe a PLL in which all of the signals within the system are digital values; no analog voltage signal is used anywhere in the system. Since analog PLLs are susceptible to temperature variations, DC drift, and numerous other factors, it is preferable to implement the master clock as an ADPLL.

A PLL receives as an input a reference signal (reference clock 24 in FIG. 2) and uses a local oscillator such as DCFS 36 to generate an output signal. A feedback loop 44 is used to feed back the output of the DCFS so that the output of the DCFS may be compared with the reference signal and an error signal generated to drive the DCFS to lock onto the reference clock 24. There are three basic modes of operation of a PLL—free running mode in which the external reference signal is not available, normal or tracking mode in which the PLL is operating as intended, and holdover mode in which the external reference signal is not available but information about an earlier reference signal is maintained to attempt to hold the PLL at approximately the same state as when the earlier reference signal was available.

Figure 3:
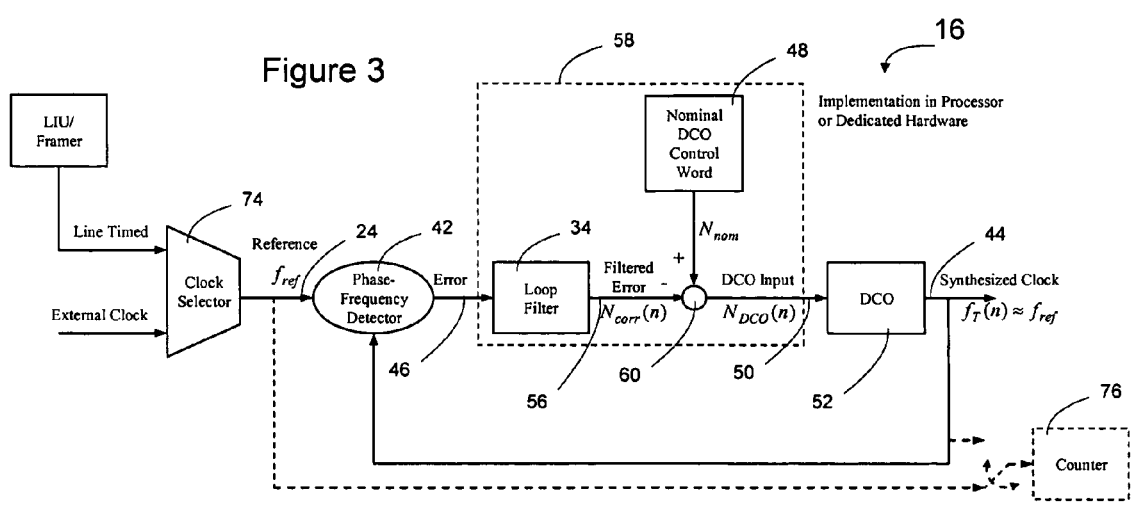
FIG. 3 is a functional block diagram of a master clock in which the DCFS is implemented as a Digitally Controlled Oscillator (DCO) according to an embodiment of the invention.
Figure 4:
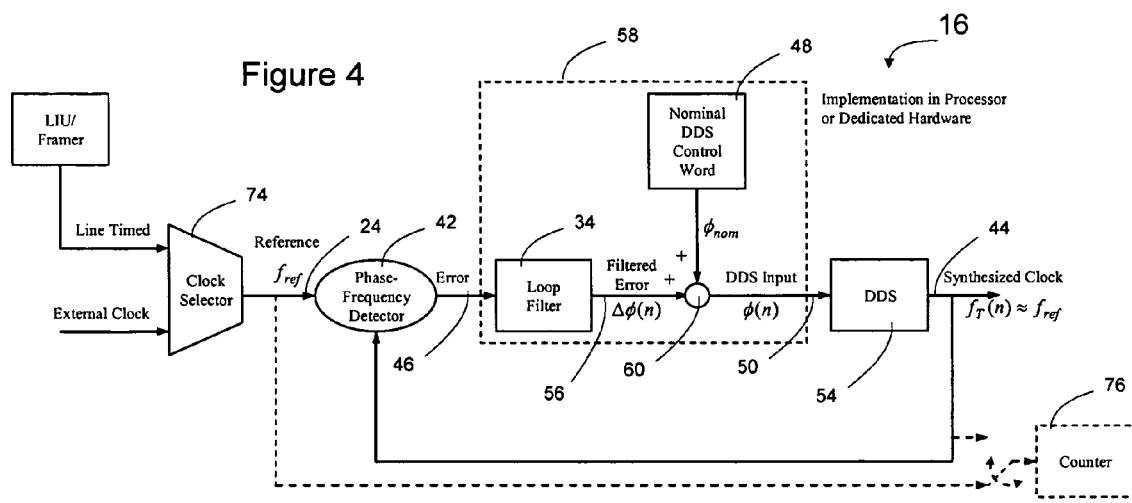
FIG. 4 is a functional block diagram of a master clock in which the DCFS is implemented as a Direct Digital Synthesizer according to an embodiment of the invention.

FIG. 2 illustrates the master clock 16 implemented as an All Digital Phase Locked Loop. FIGS. 3 and 4 illustrate particular embodiments of the master clock 16 of FIG. 2 in which the digitally controlled frequency selector (DCFS) 36 is embodied as a DCO 52 and as a DDS 54 respectively. Implementation of each of the DCO-based (FIG. 3) and DDS-based (FIG. 4) embodiments will be described in greater detail below.

As shown in FIGS. 3 & 4, the master clock 16 receives a reference clock 24 from a high quality reference source, such as a GPS clock or a Stratum 1 clock, and inputs the reference clock 24 to a comparator such as a phase detector 32 in FIG. 2 or a phase frequency detector 42.

The master clock 16 may also include a clock selector 74 to allow the input reference frequency to be obtained from a plurality of different available sources. For example, the master clock may have access to a clock signal generated by a GPS clock, a BITS, line-timed clock signal, or a free-running oscillator.

The comparator 32, 42, compares the input reference clock 24 with the current output (the synthesized clock signal) of the master clock 44 (also referred to as the synthesized clock) and generates an error signal 46. The error signal 46 represents the difference between the reference clock 24 and the synthesized clock 44 signals. The error signal 46 is filtered by a loop filter 34 and combined with a nominal control word 48 to form an input 50 to the Master local DCFS (or DCO 52 or DDS 54). The nominal control word 48 allows the frequency of the DCFS to be set to a frequency close to the input reference frequency 24 and the error signal 46 adjusts the output 44 of the DCFS 36 to lock the synthesized clock 44 onto the reference clock 24.

To enable the slave clocks to operate at the same frequency as the master, the slave clocks are provided with the same input 50 as is provided to the master DCFS 36. This may be done by transmitting the nominal control word 48 to each of the slave clocks 18 and periodically transmitting a control word formed from the filtered error signal 56 to the slave clocks, or by transmitting the control word 50 formed from combining the filtered error signal 56 with the nominal control word 48 to the slave clocks.

To allow the master clock 16 to interwork with slave clocks that configured to implement a timestamp based scheme, rather than the clock synchronization scheme described herein, the master clock may also include a counter to allow the master clock to generate explicit time indications or timestamps that can then be transmitted to the slave clocks to allow the slave clocks to synchronize their local clocks to the master clock.

A digitally controlled oscillator (DCO) is a frequency synthesizer that takes a digital control word 50 as input and generates a corresponding frequency 44. According to one embodiment of the invention, the DCFS may be formed as a DCO. An example of this embodiment is illustrated in FIG. 3.

FIG. 3 is a functional block diagram of an example master clock according to an embodiment of the invention. As shown in FIG. 3, the master clock 16 is implemented as a PLL having a phase frequency detector (PFD) 42 configured to receive an input reference signal 24 and a synthesized clock signal 44, and generate an error signal 46. The PLL also includes a DCO 52 configured to receive an input control word 50 and generate the synthesized clock signal 44. The PLL also includes a control section 58 configured to receive the error signal 46 and generate a DCO input from a nominal DCO control word 48 and a filtered error signal 56. The output 50 of the PLL control section 58 is input to the DCO 52 to affect operation of the DCO 52. By controlling the frequency of the DCO, the synthesized clock signal may be locked to the input reference signal.

The PFD 42 samples and compares the input reference signal $f_{ref}$ 24 with the reconstructed reference (or synthesized clock) $f_T$ 44 to produce digitized error samples 46 which are proportional to their phase and frequency differences. The samples are filtered by a digital filter (loop filter 34) and corresponding output samples 56 are used to control the period of the DCO. The output of the loop filter is used to correct the phase and frequency of the DCO by changing the frequency of the DCO for the next clock period in an appropriate direction. If the loop is designed properly, the reconstructed reference $f_T$ will be forced to resemble the input reference signal $f_{ref}$. The PFD is described in more detail below in connection with FIG. 10.

The PLL control section 58 generated the DCO input from the error signal 46 generated by the PFD 42 and the nominal DCO control word 48, which may be set depending by the network operator depending on the desired output frequency from the DCO. At sampling instant n, the error signal e(n) 46 produced by the PFD 42 is processed by the loop filter 34 F(z) to obtain the correction factor $N_{corr}(n)$ 56 (which could be positive or negative quantity). This correction factor is then subtracted at subtractor 60 from the nominal DCO control input $N_{nom}$ 48 (which corresponds to the nominal system frequency $f_{nom}$) to obtain a DCO control word $N_{DCO}(n)$ 50. A detail model of the DCO and the loop filter design is given below. Note that the nominal control word $N_{nom}$ 48 can be set to any desired value depending on system requirements.

The loop filter output $N_{corr}$ 56 (or alternatively, the DCO input, $N_{DCO}$ 50) is sampled periodically, for example between about 1 and 20 times per second, and the sampled value is then transmitted to the slave clocks 18 to allow them to emulate the state of the master clock. Transmission of the filtered error signal $N_{corr}$ 56 may require fewer bits than transmission of the DCO input 50, since the filtered error signal is likely to be a smaller value than the DCO input which is a combination of the filtered error signal and the nominal DCO control word. Also, since the nominal DCO control word may be known at the slaves, transmission of this component of the input signal may be unnecessary.

Figure 5:
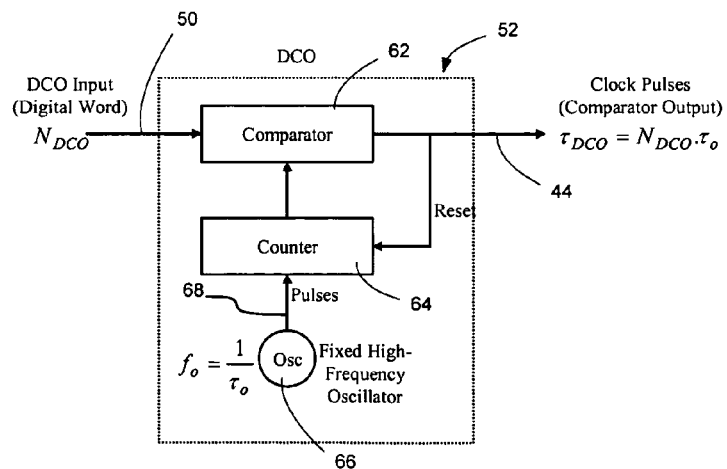
FIG. 5 is a functional block diagram of a DCO that may be used according to an embodiment of the invention.

FIG. 5 shows an example functional block diagram of a DCO. As shown in FIG. 5, a DCO 52 has a comparator 62 and a counter 64. A local high frequency oscillator 66 is provided to supply an internal reference timing signal to the DCO. This DCO behaves essentially as a programmable divide-by-N counter. The output of a stable high-speed oscillator 66 is used to drive the counter 64 which increases by one every clock cycle. The high-speed oscillator usually has a frequency, $f_o$, equal to $N_{nom}$ times the nominal frequency, $f_{nom}=1/\tau_{nom}$, where $N_{nom}$ determines the number of quantization levels and the phase error resolution over $2\pi$. The comparator 62 compares the content of the counter 64 with the control input value $N_{DCO}$ 50 and when they match, outputs a pulse which serves both as the DCO output 44 and a reset signal for the counter. Thus, the period of the counter output (the time between reset pulses) is proportional to the control word $N_{DCO}$. By varying the control input $N_{DCO}$, the frequency of the DCO output 44 can be controlled.

Figure 6:
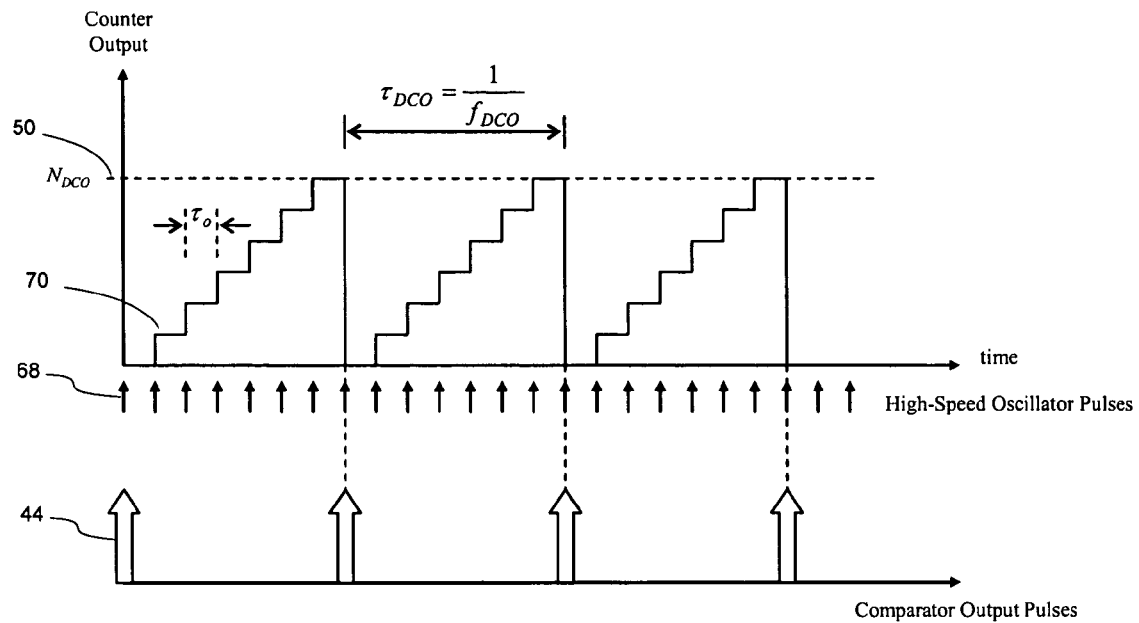
FIG. 6 is a graph showing the output of the DCO of FIG. 5 over time.

Operation of the DCO is illustrated in FIG. 6. As shown in FIG. 6, the local high frequency oscillator 66 generates high frequency pulses 68 and the counter 64 counts the pulses 70. When the counter 64 reaches value $N_{DCO}$ 50, which is set using the control word 50, the comparator 62 causes the DCO 52 to output a pulse 44.

If the DCO is operating with a control input $N_{nom}$ 48, which corresponds to the nominal frequency $f_{DCO}=f_{nom}=1/\tau_{nom}$, adding a negative quantity $-N_{corr}$ to $N_{nom}$ results in an increase in the frequency of the output 44 (since the counter has to count fewer pulses from the local oscillator), $\tau_{DCO}=(N_{nom}-N_{corr})\tau_o$, whereas adding a positive quantity $+N_{corr}$ to $N_{nom}$ results in a decrease in the frequency of the output 44, $\tau_{DCO}=(N_{nom}+N_{corr})\tau_o$. Thus, by appropriately controlling the correction factor $N_{corr}$ 56 added to $N_{nom}$ 48, the output frequency of the DCO $f_{DCO}=1/\tau_{DCO}$ can be controlled accordingly.

Figure 7:
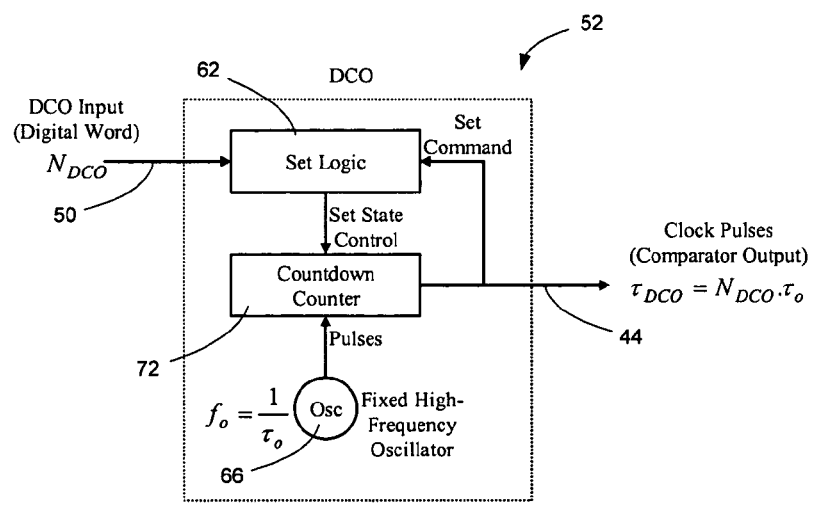
FIG. 7 is a functional block diagram of a second type of a DCO that may be used according to an embodiment of the invention.

Another implementation of the DCO is shown in FIG. 7. As shown in FIG. 7, a countdown counter 72 may be used instead of the count-up counter 64 to allow the countdown counter 72 to count down from $N_{DCO}$ 50 to zero rather than counting up from zero to $N_{DCO}$. Upon hitting the zero state, an output clock pulse 68 is generated and the countdown counter 72 is reset to $N_{DCO}$ for the beginning of the next period. Since the delay associated with recognizing a zero state is constant for any count, this approach may be preferable over the implementation shown in FIG. 5. The invention is not limited to this preferred embodiment, however.

Figure 8:
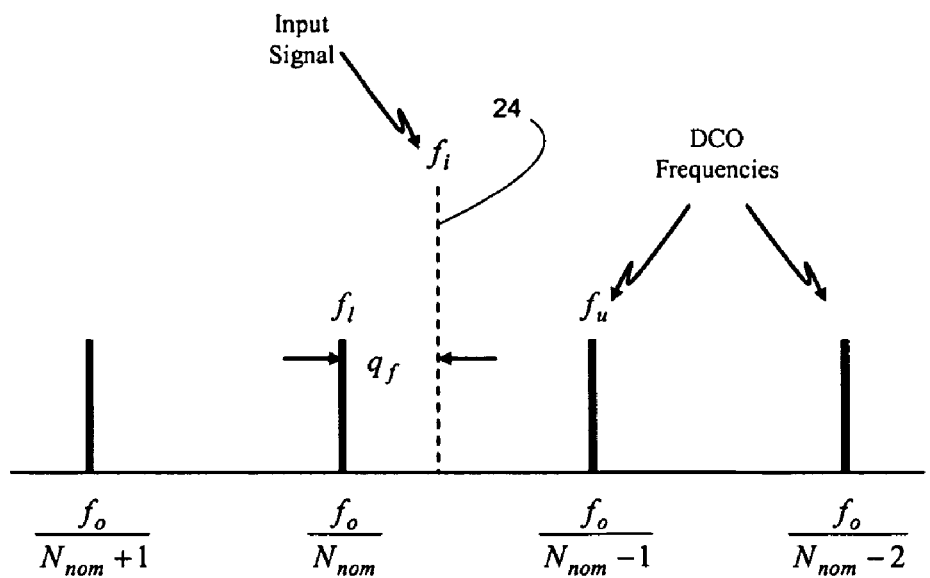
FIG. 8 is a graph illustrating discrete frequencies able to be produced by the DCO of FIG. 5 or FIG. 7.

Frequency quantization is an important consideration in the design of a digital loop, especially since this quantity can be a limiting factor in the performance of a practical implementation. FIG. 8 illustrates a graph of the discrete frequencies available to be generated by the DCO. Specifically, since the DCO counts up or down a particular number of clock cycles of the local oscillator 66, it is limited to outputting a pulse at discrete frequencies corresponding those clock cycle multiples. Where the input frequency is in between two of the frequencies able to be generated by the DCO, the PLL 30 will track the input signal frequency of the reference clock $f_i$ 24 by switching between frequencies $f_l=f_o/N_{nom}$ and $f_u=f_o/(N_{nom}-1)$ such that the average frequency of operation is $f_i$.

For small quantization errors, $f_o \gg f_{nom}$, where $f_{nom}=1/\tau_{nom}$ is the nominal frequency of operation (e.g., 1.544 MHz for a T1 link), the phase error which may occur in the DCO due to frequency quantization is $$\frac{\Delta\varphi}{2\pi} = \frac{\tau_o}{\tau_{nom}}, \quad (1)$$

or $$\Delta\varphi = \frac{2\pi f_{nom}}{f_o} = \frac{2\pi}{N_{nom}} = \frac{360°}{N_{nom}}. \quad (2)$$

For small quantization errors, for example, $\Delta\varphi \leq 7.2°$ requires that $N_{nom} \geq 50$.

Between samples, the phase error changes in a linear manner at a rate proportional to the difference between the input frequency and the DCO frequency. Since the loop averages two frequencies, one of which could be $q_f$ Hz from the input frequency, a phase change of $$\Delta\varphi = 2\pi q_f T_s, \quad (3)$$

can occur between samples, where $T_s$ is a sampling interval. Given that $\Delta\varphi/2\pi = f_{nom}\tau_o$, the quantization increment $q_f$ can be expressed as $$q_f = \frac{\Delta\varphi}{2\pi T_s} = \frac{f_{nom}\tau_o}{T_s}. \quad (4)$$

A DCO has an inherent stability equal to that of the input high-speed oscillator. If the high-speed oscillator has a frequency range of $f_o \pm \Delta f_o$, and normalized error $\pm\Delta f_o/f_o$ (which is usually expressed in parts per million, (ppm)), then for a DCO input word $N_{nom}$, the output clock will have a corresponding frequency range $$\hat{f}_s = \frac{f_o \pm \Delta f_o}{N_{nom}} = f_{nom} \pm \frac{\Delta f_o}{N_{nom}}. \quad (5)$$

The error range of the output frequency is scaled accordingly by a factor of $N_{DCO}$ and is equal to $$\Delta\hat{f}_s = \pm\frac{\Delta f_o}{N_{nom}}, \quad (6)$$

but the normalized error range stays the same as that of the high speed oscillator, i.e., $$\frac{\Delta\hat{f}_s}{f_{nom}} = \pm\frac{\Delta f_o}{N_{nom}f_{nom}} = \pm\frac{\Delta f_o}{f_o}. \quad (7)$$

Thus, the stability of the high-speed oscillator is an important factor to the overall stability of the DCO.

Several advantages of using a DCO for frequency synthesis include numeric frequency tuning, much faster tuning speed, very high tuning range, low phase noise dependent on the frequency ratio $N_{nom}$, very high frequency resolution dependent on the frequency ratio $N_{nom}$, excellent short and long term stability, highly linear frequency tuning range, and low cost and low complexity. However, the DCO will exhibit relatively high quantization noise if the value of $N_{nom}$ is too small.

A master (or slave) clock has an inherent stability equal to that of the input high-speed oscillator at the master (or slave) clock. If the high-speed oscillator at the master (or slave) clock has a frequency stability of x ppm, the master (or slave) clock will also have a corresponding frequency stability of x ppm. For the clock synchronization scheme to be stable and accurate, the DCOs will require reasonably stable high-speed oscillators. Thus, the clock accuracy at a slave clock has an inherent stability equal to that of the input high-speed oscillators at the slave and master clock. If the high-speed oscillators at the master and slave clocks have frequency ranges of $f_o \pm \Delta f_{om}$ and $f_o \pm \Delta f_{os}$, respectively, then for a given DCO control word $N_{DCO}$ generated by the master ADPLL, the slave clock will see a corresponding frequency range that embodies the error ranges $\pm\Delta f_{om}/N_{DCO}$ and $\pm\Delta f_{os}/N_{DCO}$. For the clock synchronization scheme to be accurate, the DCOs will require reasonably stable high-speed oscillators depending on the application. A method and apparatus for implementing a second level control, in which the local high frequency generators of the master and slave DCOs may be synchronized, is discussed in greater detail below in part two hereof.

Figure 9:
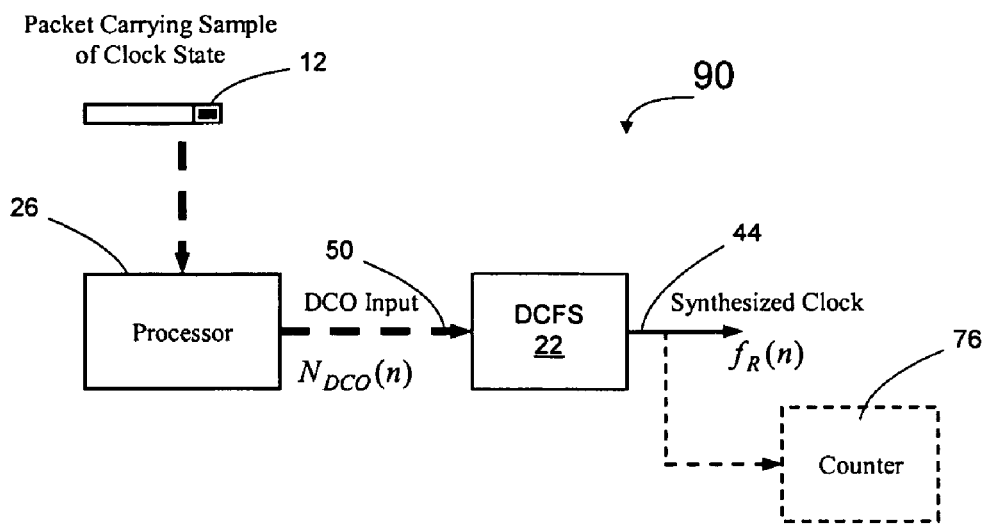
FIG. 9 is a functional block diagram of a slave clock according to an embodiment of the invention.

FIG. 9 illustrates an example of a slave clock 18 in which the DCFS is implemented as a DCO that may be used according to an embodiment of the invention. As shown in FIG. 9, the slave clock 18 includes a processor 26, a DCO 52, and optionally a counter 76. The period of the DCO is transmitted from the master clock 16 to the slave clock 18 and input, via the processor 26, to the DCO 52 to allow the DCO 52 to operate at the same frequency as the master DCO 52. The DCO control word 50 from the master clock may be transmitted over the network 14 to the slave clocks periodically, for example between 1 and 20 times per second. These samples are used to control the period of the slave DCO 52 so that the slave DCO 52 is able to reproduce the master ADPLL's frequency. Since the slave DCO 52 receives the same sequence of control word samples as used at the master DCO, the slave DCO 52 is able to replicate the master DCO frequency.

Figure 10:
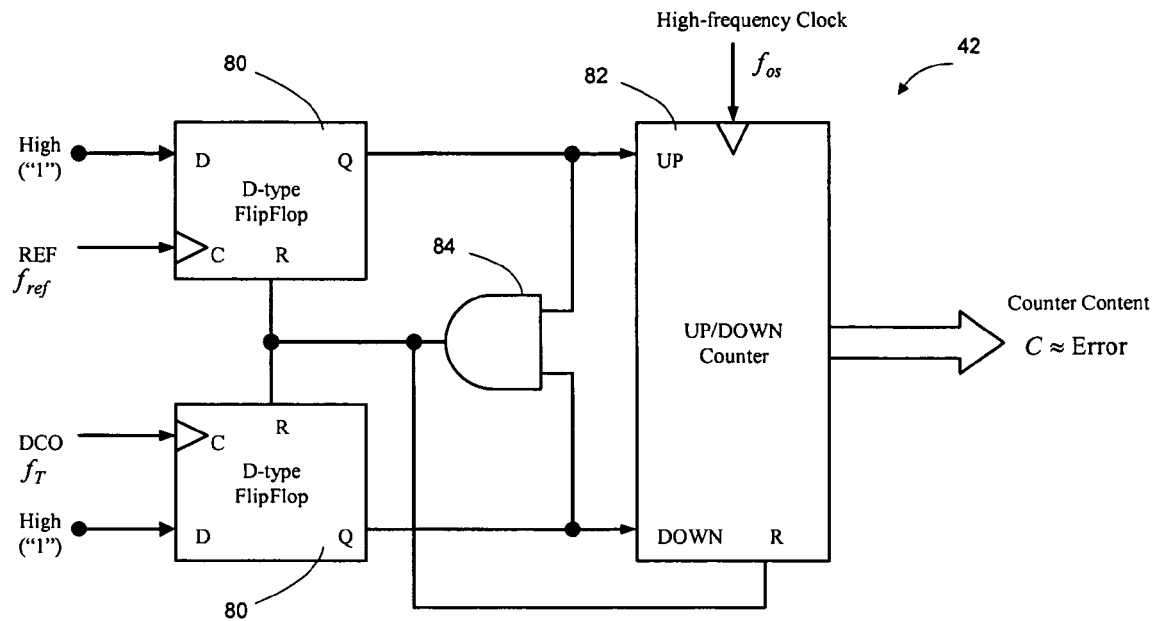
FIG. 10 is a functional block diagram of a Phase Frequency Detector (PFD) that may be used in connection with embodiments of the invention.

As shown in FIG. 3, the master clock 16 uses a digital phase-frequency detector (PFD) 42 to compare the synthesized clock signal 44 with the reference clock signal 24. A phase-frequency detector (PFD) 42 adds frequency detection to phase detection and is extremely useful because it significantly increases the acquisition range and lock speed of a PLL. PFDs are commonly used to improve the pull-in range and pull-in time of PLL circuits and are especially suited to frequency-synthesis applications with periodic inputs. A digital PFD circuit can be implemented using either D-type master-slave flip-flops or R-S latches and an up/down counter. FIG. 10 shows a PFD 42 built with D-type flip-flops 80. The outputs UP and DOWN will respond only to the positive-going edges of the inputs REF and DCO. Therefore, the input duty cycles do not have any effects on the outputs. The invention is not limited to this implementation, however, as other phase frequency detectors or phase detectors may be used as well.

Figure 11:
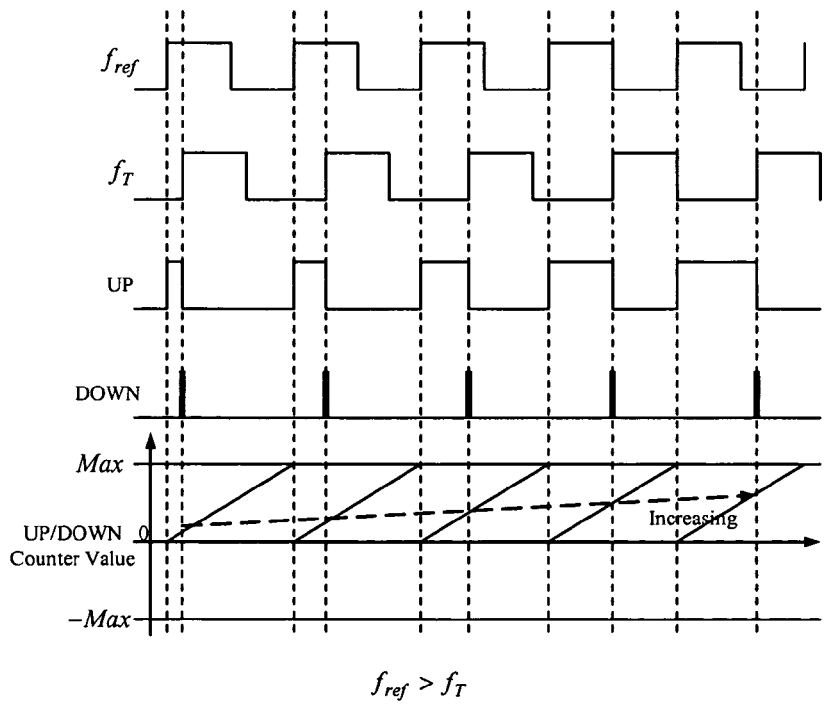
FIGS. 11-13 illustrate operation of the phase frequency detector of FIG. 10 when different input frequencies are input to the PFD.
Figure 12:
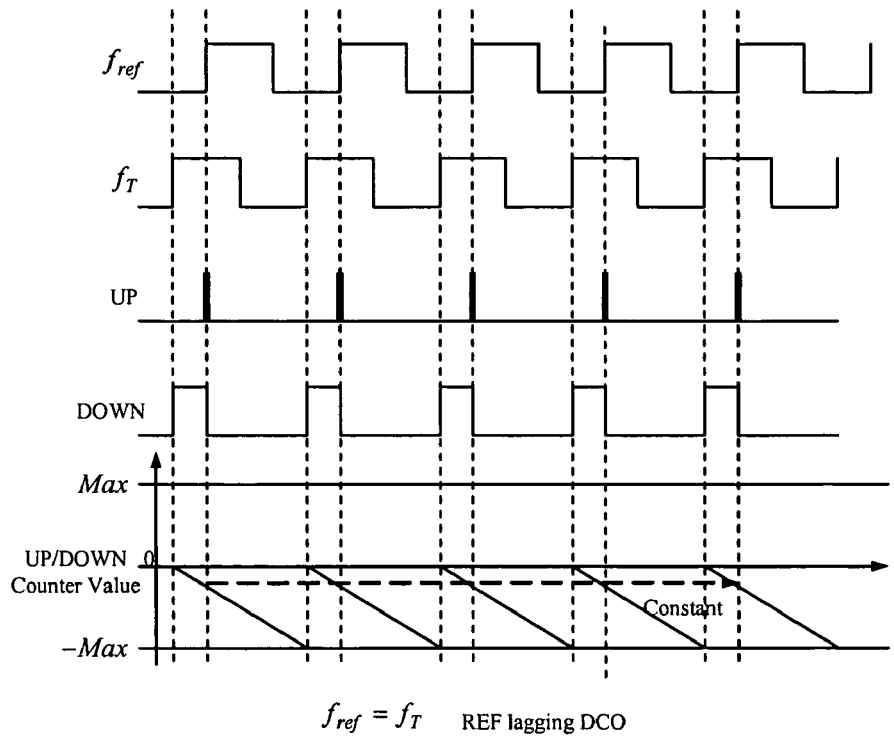
Figure 13:
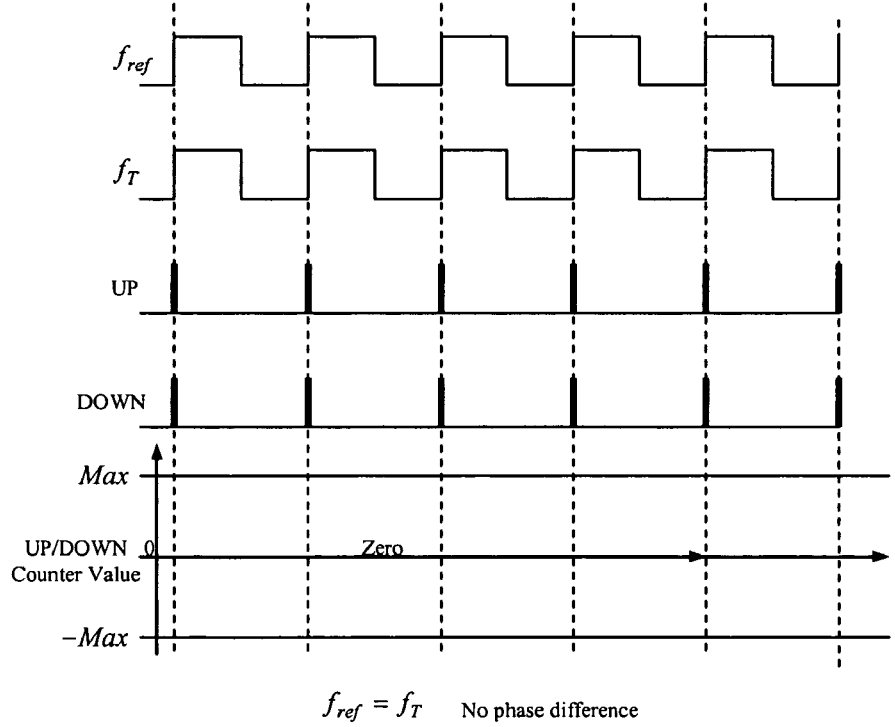

FIGS. 11-13 illustrate operation of the PFD 42. Unlike multipliers and XORs, digital tri-state comparators generate two outputs that are not complementary. If the reference frequency $f_{ref}$ is greater than that of the DCO output $f_T$, then the PFD produces increasingly more positive pulses at output UP, while output DOWN remains at zero. In FIG. 11, REF leads DCO, hence the PFD 42 toggles between the states {UP=0, DOWN=0} and {UP=1, DOWN=0}. The time average value of the differential output, (UP−DOWN)$_{AVE}$, measured by the high-speed counter is an indication of phase difference between the clock reference REF and DCO output. The UP/DOWN counter output also increases with time since $f_{ref} > f_T$. Thus, the counter output varies monotonically with frequency error $\Delta f = f_{ref} - f_T$ when the ADPLL is out of lock. Conversely, if $f_{ref} < f_T$, then increasingly more negative pulses appear at output DOWN, while UP is zero. In this case the PFD toggles between the states {UP=0, DOWN=0} and {UP=0, DOWN=1}.

If $f_{ref} = f_T$ but there is a phase difference between REF and DCO, as shown in FIG. 12, then the circuit generates pulses at either UP or DOWN with a width equal to the phase difference between the two inputs. When the two frequencies are equal, one of the outputs has a duty cycle that is a function of the difference between the input transition times while the other output remains inactive or low. Note that, in principle, UP and DOWN are never high simultaneously. Thus, the time average value of the differential output, (UP−DOWN)$_{AVE}$, measured by the high-speed counter, is an indication of phase difference between the clock reference REF and DCO output. Since REF lags DCO in FIG. 12, the PFD toggles between the states {UP=$_0$, DOWN=0} and {UP=0, DOWN=1}, and the UP/DOWN counter also outputs a constant nonzero value with time.

For example, assume that the PFD is in the {UP=0 and DOWN=0} state initially. If $f_{ref} = f_T$ and there is zero phase error between REF and DCO as shown in FIG. 13, the REF and DCO are exactly in phase (i.e., both positive edge of REF and DCO occur at the same time), hence their effects cancel. The PFD stays in the state {UP=0 and DOWN=0} forever. The UP/DOWN counter outputs a constant stream of zeros.

Since the output signal of the PFD depends on the phase error in the locked state of the DPLL and on the frequency error in the unlocked state, a DPLL which uses a PFD will lock under any condition, irrespective of the type of loop filter used.

Assume now that the reference clock period is quantized (by the high-speed clock with frequency $f_{os} = 1/\tau_{os}$) into M=Max steps, i.e., Max=$\tau_{nom}/\tau_{os}$. Note that the high-speed clock driving the PFD may be different from that driving the DCO. If the two clocks are equal, i.e., $f_{os} = f_o$, then Max=$N_{nom}$. The UP-DOWN counter is a binary counter of certain size whose upper limit can be denoted as Max. The counter operates at the speed (or multiple) of the high-speed DCO. It counts up or down, initially from zero, at every high-speed clock tick until it reaches Max−1, and then it will roll over and start again. The value stored in the counter is latched out by the active rising edge of the reference clock REF. Therefore, when the DCO is frequency locked to the reference clock, the counter value should be a fixed number (see FIG. 12); the counter should output the same value at each active edge of REF after the ADPLL is locked.

Figure 14:
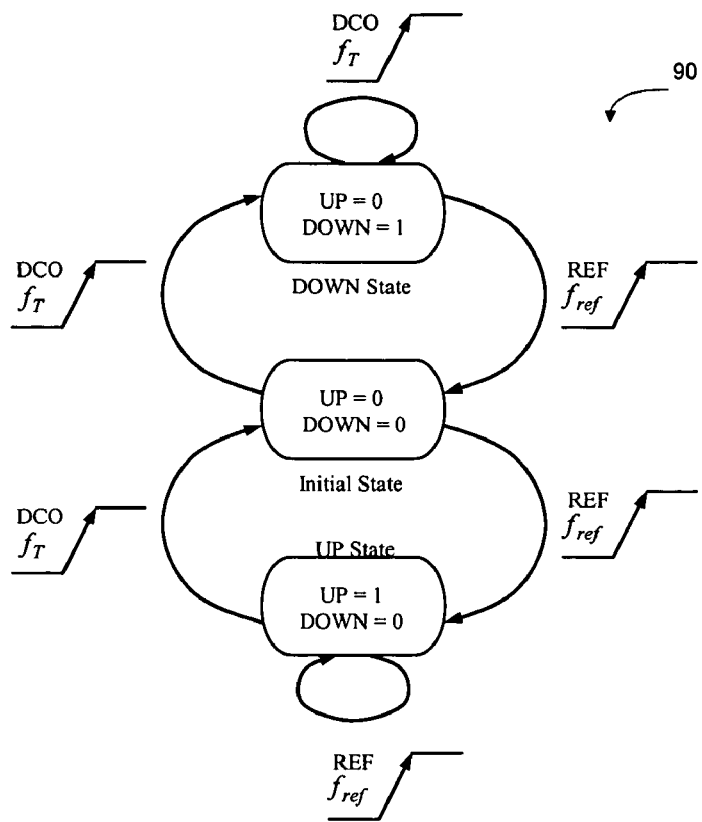
FIG. 14 is a state diagram of the PFD of FIG. 10.

FIG. 14 illustrates the state diagram of the PFD. The PFD can be in one of three states: {UP=0, DOWN=0}; {UP=1, DOWN=0}; and {UP=0, DOWN=1}. A fourth state {UP=1, DOWN=1} is inhibited by the addition of the AND gate 84. Thus, whenever both flip-flops 80 are in the 1 (high) state, a logic "high" level appears at their R ("reset") inputs which resets both flip-flops. Consequently the PFD acts as a tri-state comparator.

The D-type flip-flops 80 are triggered by the positive-going edges of inputs, REF and DCO, to the PFD. Initially, both outputs are low. When one of the PFD inputs rises, the corresponding output becomes high. The state of the finite-state machine 90 of FIG. 14 (FSM) moves from an initial state to an UP or DOWN state. This state is held until the second input goes high, which in turn resets the circuit and returns the FSM 90 to the initial state.

Two important observations may be made from the waveforms shown in FIGS. 11-13. Specifically, it is apparent that the UP/DOWN counter attains its largest value when the phase error is positive and approaches 2π, and its smallest value when the phase error is negative and approaches −2π.

Figure 15:
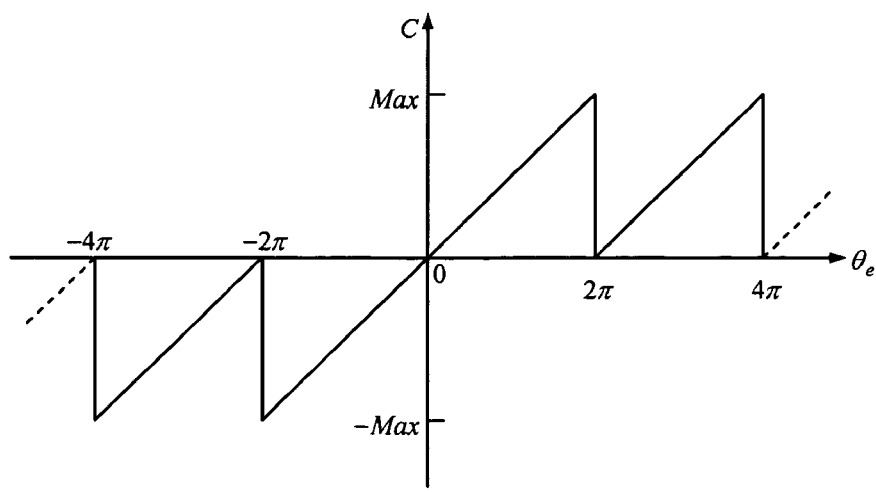
FIGS. 15 and 16 show the change of the output of the PFD with phase.

To illustrate this, FIG. 15 shows a plot of the counter output C versus phase error $\theta_e$. As shown in FIG. 15, the output of the counter forms a sawtooth function. This represents the characteristics curve of the PFD 42 and covers phase errors greater than 2π or smaller than −2π. The curve is periodic with period 2π. The PFD output is ideally linear for the entire range of input phase differences from −2π to 2π radian and has maximum output at Max.

The slope of the PFD characteristic curve shown in FIG. 15 is equivalent to the gain of the PFD. The slope of the PFD characteristic curve is given by $$K_{PFD} = \frac{\text{Max}}{2\pi}. \qquad (8)$$

When the phase error is restricted to the range $-2\pi < \theta_e < 2\pi$, the counter output becomes $$C(\theta_e) = \frac{\text{Max}}{2\pi} \theta_e = K_{PFD} \theta_e. \qquad (9)$$

In FIG. 10, for instance, the REF is running faster than the DCO. Thus, the time interval between the REF rising edge and the DCO rising edge keeps increases as time progresses. When the PFD counter value reaches its maximum Max (or minimum −Max), assuming positive slope (or negative slope), it starts back at 0, i.e., resets and increases (or decreases). Depending on the phase/frequency difference between REF and DCO, the slope may be positive or negative and the slope basically stays the same until the next reset.

Figure 16:
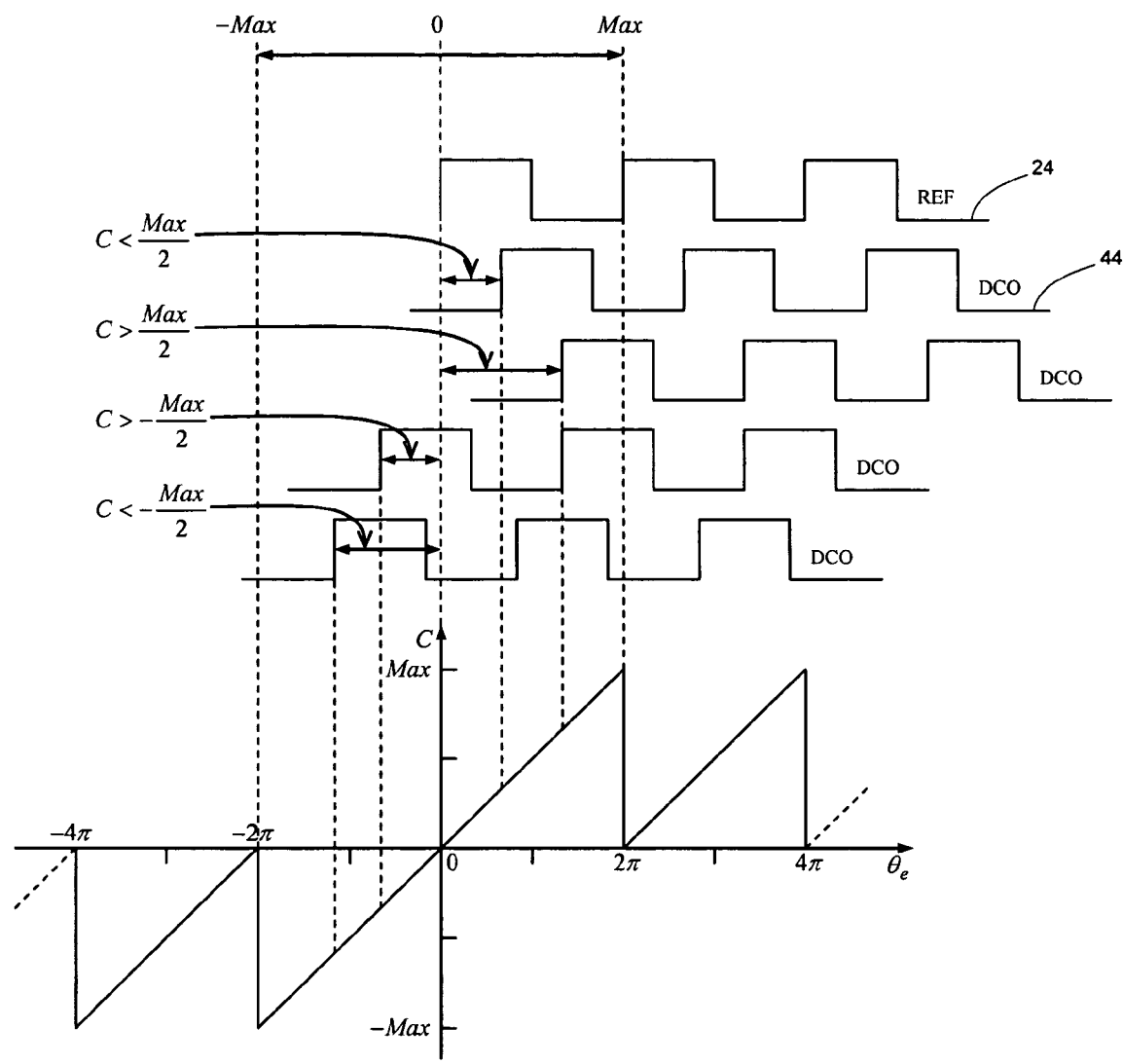

To interface with the loop filter, the PFD is implemented as follows (see FIG. 16):

1. At each rising edge of REF, latch out the PFD counter value C(n)
2. Convert this value C(n) to a phase error e(n) by using the following expression:

$$\text{if } C(n) > \frac{\text{Max}}{2} \text{ then } e(n) = C(n) - \text{Max}$$
$$\text{else } e(n) = C(n)$$
$$\text{if } C(n) < -\frac{\text{Max}}{2} \text{ then } e(n) = C(n) + \text{Max}$$
$$\text{else } e(n) = C(n)$$

3. Pass e(n) to the loop filter 34 for processing

Under normal circumstances (typical applications), the DCO and the PFD will be driven by the same high-frequency oscillator $f_o$. In this case, the high-frequency oscillator is selected to have a frequency of $f_{os} = f_o = \text{Max} \cdot f_{nom} = N_{nom} \cdot f_{nom}$. With this, the counter for both PFD and DCO will have the same maximum values.

Figure 17:
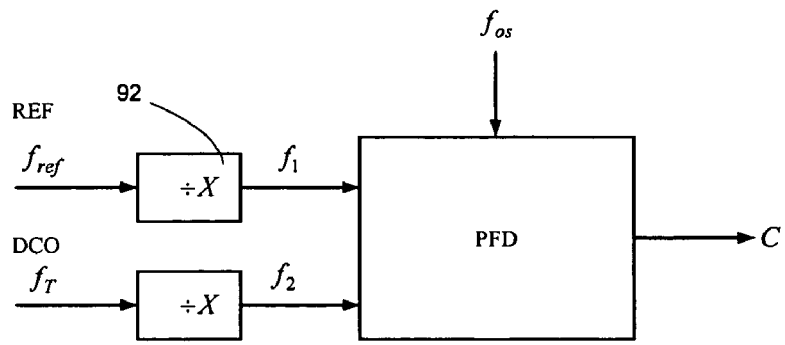
FIG. 17 is a functional block diagram of a PFD including divide by X frequency reducers.
Figure 18:
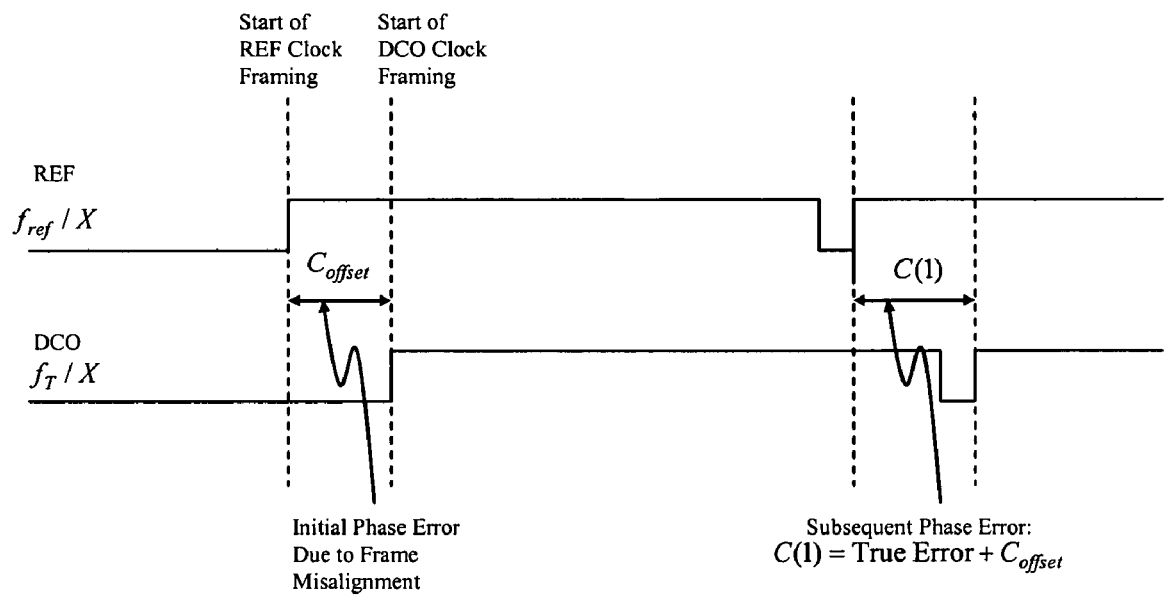
FIG. 18 illustrates operation of the PFD of FIG. 17.

In a practical implementation, to allow for the loop filter to be implemented in software on a processor, the inputs REF and DCO may be divided down to 8 KHz (or even 4 or 2 KHz) frame rates and fed to the PFD, as shown in FIG. 17. A divide-by-X counter 92 is used in this case on the REF and DCO clocks. For example, for a T1 reference clock, X can be 193 (i.e., equal to a T1 frame length) or a multiple thereof. In this case the input frequencies to the PFD will be $f_1=f_{ref}/X$ and $f_2=f_T/X$ instead of frequencies $f_{ref}$ and $f_T$. The scaled-down nominal frequency will be defined as $f_{temp}=f_{nom}/X$. The maximum phase error then will be given as Max=$f_{os}/f_{temp}$.

Where the inputs are divided by X before being fed to the PFD, the input REF and DCO frames would not necessarily be aligned initially before entering the PFD. An example of this is illustrated in FIG. 18. As shown in FIG. 18, the initial misalignment between the frames may produce a static phase error $C_s$ at the PFD output which can be confused with a genuine phase error due to a true phase offset between REF and DCO. This static error has to be determined and accounted for in all PFD outputs. To remove this initial static phase error $C_{offset}$ which is due to the initial misalignment between the REF and DCO frames, $C_{offset}$ is determined at every system startup (or reset time), and subtracted from all PFD outputs including the initial PFD output. An alternative solution is to align REF and DCO at the frame level before entering the PFD. But this alternative solution could be difficult to implement because an initial alignment of REF and DCO at the frame level will require also alignment at the bit level.

According to an embodiment of the invention, values obtained from the PFD are converted into error values meaningful for adjusting the DCO frequency. The error values may be obtained such that the conversion allows the initial misalignment error $C_{offset}$ shown in FIG. 18 to be taken into account automatically. The following pseudo code may be used to obtain error values that may be used to adjust the DCO frequency. The invention is not limited to the use of this particular pseudo code as numerous ways of obtaining error values may be used as well.

C(n) is the phase count between the rising edge of the reference signal, REF, and the following rising edge of the recovered signal, DCO.

$0 \leq C(n) \leq Max$. Max is the maximum phase error.

C(n)'s will have positive slope if $f_{ref} > f_T$, except when it crosses over Max to 0.

C(n)'s will have negative slope if $f_{ref} < f_T$, except when it crosses over 0 to Max.

There is the need to remove any constant phase offset from the error values to be used in the subsequent computations.

$0 \leq C_{offset} \leq Max$

When frequency lock is achieved, the C(n) obtained is constant which may be equaled to $C_{offset}$.

The algorithm is assumed to work within $$\pm \frac{Max}{2}$$

around the initially selected offset.

Monitoring Guidelines:
  C(n) should not be larger than Max.
  $f_{ref}$ and $f_T$ are locked if C(n)'s are constant or close to the initial offset $C_{offset}$.

Interpreting C(n) as an Error Value:
  If the current phase detector count value C(n) is greater than $C_{offset}$, and less than ($C_{offset}$+Max/2)mod(Max), then the reference signal REF is faster than the recovered signal DCO and the recovered signal has to speed up.
  If the current phase detector count value C(n) is less than $C_{offset}$, and greater than [$C_{offset}$−Max/2]mod(Max), then the reference signal REF is slower than the recovered signal DCO and the recovered signal has to slow down.

Determining the Offset Configuration:
  1. if $C_{offset}$<=Max/2 offset_case=left_of_max/2
  2. if $C_{offset}$>Max/2 offset_case=right_of_max/2
  3. if $C_{offset}$==0 offset_case=on_zero
  4. if $C_{offset}$==Max offset_case=on_max Effective Error Value:

```
if offset_case == left_of_max/2
    if C(n) <= C_offset then e(n) = -(C_offset - C(n)) /* slow down DCO */
    else if C(n) > C_offset + Max/2 then e(n) = -(Max - C(n) + C_offset) /* slow down DCO */
    else e(n) = C(n) - C_offset /* speed up DCO */
if offset_case == right_of_max/2
    if C(n) > C_offset then e(n) = C(n) - C_offset /* speed up DCO */
    else if C(n) < C_offset - Max/2 then e(n) = Max - C_offset + C(n) /* speed up DCO */
    else e(n) = -(C_offset - C(n)) /* slow down DCO */
if offset_case == on_zero
    if C(n) > C_offset + Max/2 then e(n) = -(Max - C(n) + C_offset) /* slow down DCO */
    else e(n) = C(n) - C_offset /* speed up DCO */
if offset_case == on_max
    if C(n) < C_offset - Max/2 then e(n) = Max - C_offset + C(n) /* speed up DCO */
    else e(n) = -(C_offset - C(n)) /* slow down DCO */
```

Consolidated Algorithm:

```
if C(n) < C_offset - Max/2 then e(n) = Max - C_offset + C(n) /* speed up DCO */
else if C(n) <= C_offset then e(n) = -(C_offset - C(n)) /* slow down DCO */
else if C(n) > C_offset + Max/2 then e(n) = -(Max - C(n) + C_offset) /* slow down DCO */
else e(n) = C(n) - C_offset /* speed up DCO */
```

Further Consolidation for Interpreting C(n) (Lines 2 & 4 Above Consolidated):

--- if C(n) < $C_{offset}$ – Max/2 then e(n) = Max – $C_{offset}$ + C(n) /* speed up DCO */
else if C(n) > $C_{offset}$ + Max/2 then e(n) = –(Max – C(n) + $C_{offset}$) /* slow down DCO */
else e(n) = C(n) – $C_{offset}$ /* speed up if C(n) > $C_{offset}$ and slow down if C(n) <= $C_{offset}$ */

---

Processing of Phase Count Values to Obtain Error Values:

Initialization:
    let $C_{offset}$=C(0) be the first phase count value received after waiting for some reasonable amount of time
    set nominal frequency $f_{nom}$
    set frequency division factor X
    compute Max=$f_{os}$·X/$f_{nom}$ Procedure:
1. Set the first phase detector count value, C(0), as the offset $C_{offset}$=C(0)
2. Do the following processing for all subsequent phase detector count values, C(n) to obtain their corresponding error values, where n>0

--- if C(n) < $C_{offset}$ – Max/2 then
        e(n) = Max – $C_{offset}$ + C(n) /* speed up DCO */
    else if C(n) > $C_{offset}$ + Max/2 then
        e(n) = –(Max – C(n) + $C_{offset}$) /* slow down DCO */
    else e(n) = C(n) – $C_{offset}$ /* that is speed up if C(n) > $C_{offset}$ and slow down if C(n) < $C_{offset}$ */

---

With this pseudo code, it is possible to generate the error signal e(n) that can be used to control the DCO 52 in the master clock PLL 30 to adjust the output frequency of the DCO 52. As shown in FIG. 3, the error signal e(n) 46 from the PFD 42 is passed to a digital loop filter 34, the output of which, $N_{corr}$(n) 56, is subtracted from the nominal DCO control input, $N_{nom}$ 48, to obtain a DCO control word $N_{DCO}$(n) 50. Specifically, the filtered error $N_{corr}$(n) 56 is subtracted from the nominal control word 48 at subtracting node 60 to generate the DCO control word $N_{DCO}$(n) 50. This DCO control word 50 is then used to adjust the DCO frequency so that the phase/frequency error is reduced. The DCO control word or the filtered error $N_{corr}$(n) 56 generated using this process will also be transmitted to the slave clocks 18 to allow them to replicate the output frequency of the DCO 52.

Figure 19:
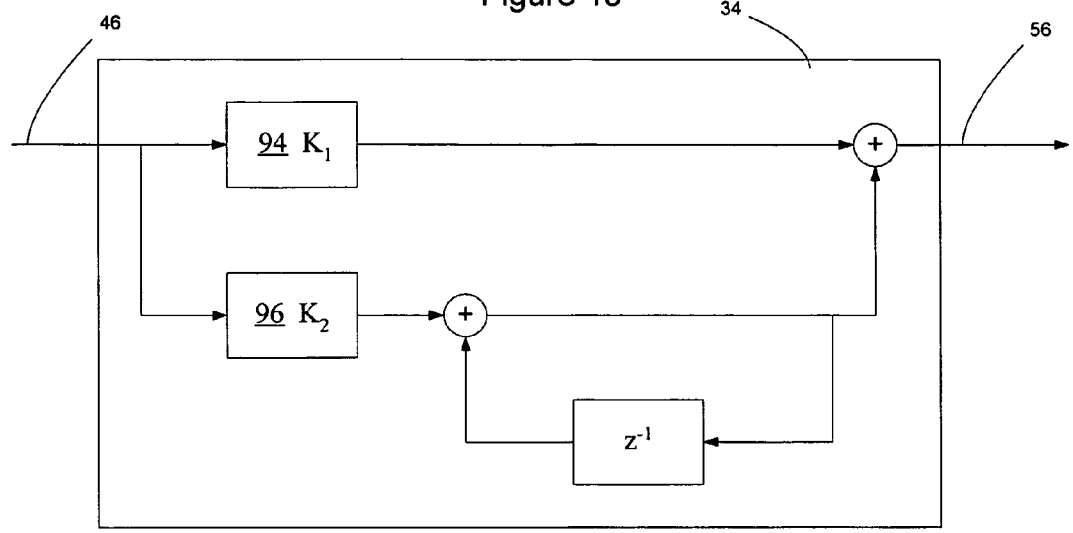
FIG. 19 is a functional block diagram of a loop filter that may be used in connection with embodiments of the invention.

Depending on the PFD sampling frequency, the low-pass filter can be implemented in software on a processor which controls the DCO. The processor computes the DCO control word $N_{DCO}$ by using the output from the PFD. FIG. 19 illustrates an example of a loop filter in which the loop filter is implemented to have two sets of gains (K1 and K2) optimized for two different operating modes. As shown in FIG. 19, the loop filter has a first gain K1 94 and a second gain K2 96 which allow the loop filter to respond differently under different operating conditions. The filter gains of the loop filter may be adjusted dynamically on the fly, with greater gain in the startup process for fast locking (acquisition mode) and smaller gain in steady-state for better stability and steady-state error (tracking mode).

The acquisition mode, with faster response, is used to bring the ADPLL into synchronism with the reference. This faster response is necessary initially, and each time after an extended free-run period, whenever the DCO clock frequency 44 differs from the reference frequency 24 by more than the capture range of the tracking mode.

The normal or tracking mode, with very slow response provides the desired frequency stability and low-output jitter of the DCO which is master to a number of other DCOs in the timing hierarchy. It also permits integration and consequent attenuation of short-term (up to one day) phase wander which enables the DCO to free-run at very near the mean reference frequency after it is cut off from its own synchronization source. Other benefits of the slow tracking mode are the ability to detect unusual long-term disturbances (such as excessive frequency drift) by simple inspection of the phase detector output, and the ability to bridge short-term disturbances (phase hits).

To analyze and design a control system, it generally is necessary to obtain a quantitative mathematical description or model of the system. Since a person of ordinary skill in the art would be able to create a mathematical model of the PLL in connection with designing the PLL, additional details of a particular mathematical model have been omitted to avoid obscuring the invention. One example of a mathematical model that may be used to describe an example PLL is set forth in provisional application No. 60/674,231 the content of which is hereby incorporated herein by reference, although other mathematical models may be implemented as well and the invention is not limited to the embodiment(s) disclosed in this provisional application.

Direct Digital Synthesizer

As shown in FIG. 3 and described above, the Digitally Controlled Frequency Selector (DCFS) 36 of the master clock 16 was implemented as a DCO. Alternatively, the DCFS 26 may be implemented as a Direct Digital Synthesizer (DDS) 54 as shown in FIG. 4. Other digital circuits may be used as well and the invention is not limited to an embodiment that uses a DCO or a DDS.

As discussed in greater detail below, the master clock 16 of this embodiment shown in FIG. 4 uses a DDS 54 to generate an accurate reference signal with a frequency and phase that can be precisely controlled in real time. The DDS is formed as part of a PLL that forms the master clock so that the master clock can lock onto a reference frequency 24. The parameters that are used to control the DDS are captured during operation and passed over the network 14 to the slave clocks 18. The slave clocks 18 are implemented as DDSs 54 without the other components of the PLL. Thus, the slave clocks may be implemented without using a PLL structure to thereby make them less expensive to implement. Operation of the master and slave clocks may be achieved by the transmission of the control parameters (e.g. DDS input 50) from the master clock 16 to the slave clock 18 such that the DDSs 54 at the slave clocks 18 are operated using the same DDS control word as the DDS that is implemented in the master clock. In this manner, the slave DDSs 54 are able to recreate the state of the master clock 16 so that the slave clocks 18 and master clock 16 may be synchronized.

A DDS is able to produce an accurate reference signal whose frequency and phase can be precisely controlled in real time. The term "frequency synthesizer" defines an active electronic device that accepts an input reference frequency and then generates one or more new frequencies as commanded by a control word, whereby the stability, accuracy, and spectral purity of the output correlates with the performance of the input reference.

Figure 20:
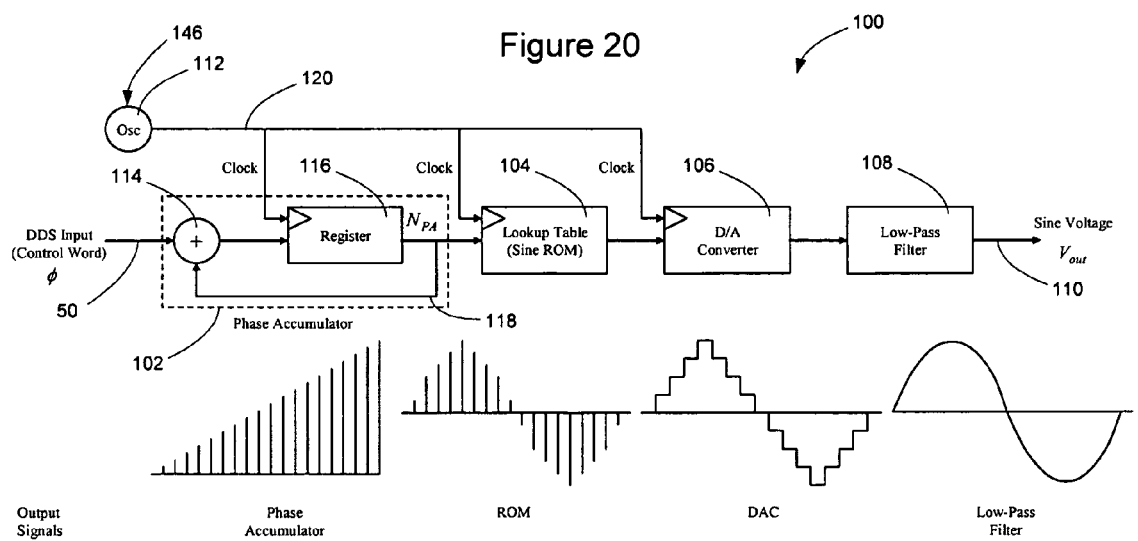
FIG. 20 is a functional block diagram of a Direct Digital Synthesizer (DDS) according to an embodiment of the invention.

FIG. 20 illustrates an embodiment of a DDS that may be used according to one embodiment of the invention. As shown in FIG. 20, a DDS 100 includes a phase accumulator (or adder/accumulator) 102, a mapping device (such as a read-only-memory (ROM) or random-access memory (RAM)) 104, and a digital to analog converter (DAC) 106. A low-pass filter 108 may be implemented at the output of the DAC 106, but this component is generally not considered a part of the DDS itself.

Direct digital synthesis generates a new output signal 44 based upon an original reference clock signal 112. While this technique essentially mimics traditional phase-locked loop synthesis, all frequencies are generated as digital representations of the desired signal using digital sampling techniques. This approach inherently affords great flexibility to the designer in terms of control and accuracy of the selected frequency. The digital output from the DDS is usually reconstructed with an accurate high-speed Digital-to-Analog Converter (DAC) 106 and then filtered via filter 108 to provide an analog output signal. Since the DDS chip contains all the digital processing to construct and manipulate a frequency, most analog circuitry (apart from the DAC) is eliminated, along with the disadvantages inherent to analog components.

The synthesis of frequencies via direct digital synthesis involves the generation of a waveform from a series of digital numbers which are then converted into analog form by a DAC. The DDS seems architecturally simple, yet provides persuasive advantages that are difficult or expensive to achieve with alternative synthesis methods. These advantages include, among other benefits, very fast switching, fine frequency resolution, excellent phase noise, transient-free (phase continuous) frequency changes, frequency agility and extraordinary flexibility as a modulator, and small size.

The DDS has disadvantages also, of which two may impose serious restrictions. First, the operating range of a DDS is limited by Nyquist sampling theory, which limits the output waveform to be at most half the input reference frequency. For practical reasons, this may be further limited to about one half of the maximum clock rate at which the logic can be operated where the logic operates at a slower clock speed than the input frequency. The second limitation is spectral purity, which is governed by the density/complexity of the logic circuitry that is attainable at the desired operating speed. Spectral purity and operating bandwidth are inversely correlated. When a DDS is to be implemented as part of the master clock, the DDS may be used to generate a Sine wave. Although each of the components of the DDS will be explained in connection with generation of a sine wave, the invention is not limited to use of a DDS to generate a Sine wave, as other waveforms may be used if desired.

The phase accumulator generates the phase component of the output clock. Specifically, the phase accumulator will cycle through $2\pi$ radians in increments specified by the change in phase per clock cycle. The change in phase per clock cycle is set by the DDS input control word 50. By changing the amount of phase that is accumulated during each clock cycle, the frequency of the output signal may be adjusted.

The phase accumulator may be implemented using a q-bit adder 114 and a register 116. The q-bit adder 114, in this embodiment, has two inputs, one of which is connected to the DDS input control word $\phi=\Delta\theta$ (DDS control word 50) and the other of which is connected to the previous sum 118 stored in the register 116. The range of phase numbers $2^q$ is spread across one cycle of the sine wave, thus $2\pi=2^q$. It may be shown that the generated output frequency may be expressed as:

$$f_{out} = \frac{\phi \cdot f_o}{2^q}. \tag{10}$$

The phase accumulator represents a cyclic phase generator producing a time series of binary integer values (phase sequence) corresponding to the oscillator progression of phase. Stated differently, the phase accumulator generates a phase value of the output waveform for each cycle of the fixed high-frequency oscillator. Since the phase of a Sine wave changes linearly with time, a set value may be added to the accumulator during each clock cycle to cause the output phase of the Sine wave to change a particular amount for the clock cycle. By changing the amount of phase accumulated during a given clock cycle (by changing the DDS input control word 50) the frequency of the output signal 44 may be adjusted.

Figure 21:
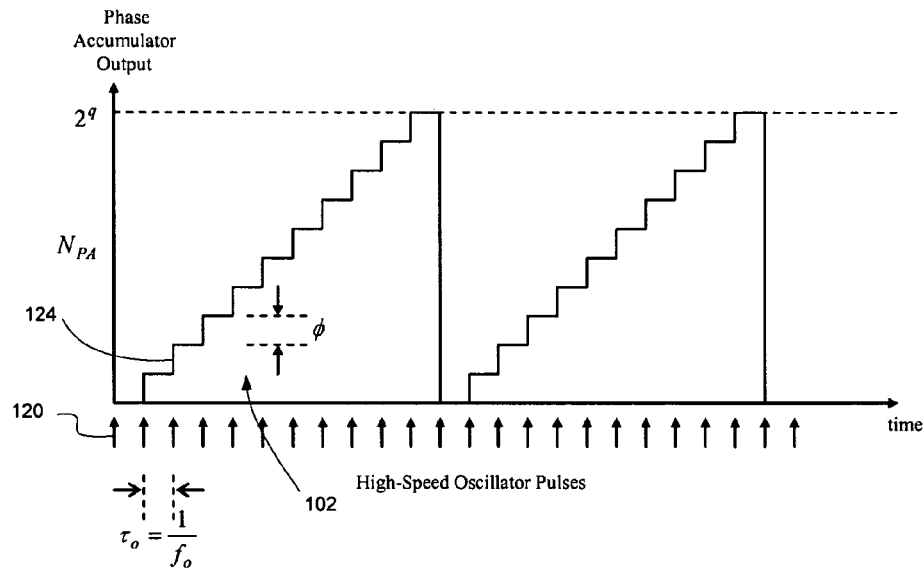
FIG. 21 illustrates operation of the DDS of FIG. 20 over time.

The phase sequence is generated by a q-bit accumulator clocked at the sample rate, $f_o=1/\delta t$ 120, which accumulates a phase increment, $\phi$, modulo $2^q$. As shown in FIG. 21, the phase accumulator is capable of repeatedly adding a programmable binary phase input value $\phi$ set using the control word 50 to the content 116 of the accumulator 102. This is equivalent to performing the following mathematical integration $$N_{PA}(n\delta t)=[N_{PA}(n\delta t-\delta t)+\phi]\text{modulo } 2^q, \tag{11}$$

where $N_{PA}(n\delta t)$ is the content of the phase register (which represents DDS phase in fractional cycles), n is the time index, and $\delta t$ is the sampling interval. The value of $N_{PA}(n\delta t)$ is bounded by the width (number of bits) of the input $\phi$ and of the accumulator (q number of bits). Note that a cycle is equal to $2^q$ since the counter will overflow once it reaches $2^q$ causing the phase to return to zero. Hence, $N_{PA}(n\delta t)$ is always modulo $2^q$. $N_{PA}(0)$ represents the accumulator initial condition at n=0, which can take a value of zero or higher value to produce an initial phase shift. The complete set of discrete states generated by the accumulator may be evenly mapped as phase values around a circle. This would correspond to the discrete output waveform values. The restriction imposed on the phase accumulator by the finite width results in an overflow inherent in the binary adder. This implies a phase zero crossing upon overflow. The frequency of overflow thus dictates the frequency of the output signal. The particular control word required to generate a particular output frequency will thus depend on the length of the register 116 and the speed of the reference clock 120.

From this it follows that the DDS phase output in radians is $$\theta_{PA} = \frac{2\pi}{2^q} N_{PA}(n\delta t). \tag{12}$$

which means that the DDS divides the range of the input signal $(0,2\pi)$ into $2^q$ equal increments. The DDS control word 50 indicates the step size 124 with which the phase will be incremented during each clock cycle. The stored value 116 in the accumulator represents the current phase of a cyclical function.

The input to the phase accumulator is the frequency control word φ 50. Since the control word 50 represents a q-bit digital value, the output frequency of the DDS $f_{out}$ 40 is changed by variation of the input control word. The above phase accumulator arrangement forms a frequency generator at a fixed rate for given values of φ and $f_o=1/\delta t$.

Whereas the size of the phase increment determines the actual output frequency, the frequency resolution is determined by the number of bits in the phase accumulator register. The frequency increment (or resolution) of a DDS is defined as $$\delta f_{out} = \frac{f_o}{2^q}. \qquad (13)$$

As is readily apparent, the frequency resolution of the DDS is a function of the clock frequency $f_o$ and the number of bits q employed in the register 116 of the phase accumulator. A longer phase accumulator register, therefore, will allow finer frequency tuning to take place. The phase accumulator must have a sufficient field width to span the desired frequency resolution. For practical applications, a large number of bits are allocated to the phase accumulator in order to satisfy the system frequency resolution requirements. Given the resolution $\delta f_{out}$ and the clock frequency, the required number of bits is given as $$q = \log_2\left[\frac{f_o}{\delta f_{out}}\right]. \qquad (14)$$

The finite length of the register introduces a source of quantizing noise into the DDS. Commercially available DDSs with register lengths between 24 and 64 bits may be used to implement the DDS, although the invention is not limited to an implementation having a register in this length range as other DDSs may be used as well depending on the particular implementation. A longer register entails some penalty—in power consumption, cost, chip area, spurious outputs, or speed (i.e., a larger q results in a slower accumulator rate of internal addition due to carry propagation)—so there is an incentive to minimize its size. But an excessively short register entails a performance penalty because the quantization noise may become too large. To balance these competing considerations, the phase jitter caused by frequency quantization may be calculated using known techniques so that an informed trade-off can be made.

Once the phase information is generated, it will be converted to a sinusoidal value using the lookup table 104, which stores samples of a sinusoid according to phase. The phase accumulator is used to generate a suitable phase argument that is mapped by the lookup table to obtain the desired output waveform value. Thus, the second component in a DDS is a memory such as a Read Only Memory (ROM) or a Random Access Memory (RAM) or mapping device 104 that performs the nonlinear transformation of ωt ⇒ sin(ωt). Given that the nth location of the lookup table is defined by $\sin(2\pi n/2^q)$, with n ∈ $[0, 2^q-1]$, the phase mapped signal is simply $\sin(2\pi\phi n/2^q)$. Comparing this with a generalized discrete-time sinusoid of frequency, $f_{out}$, reveals the output frequency is $f_{out}=\phi f_o/2^q$.

The ROM/RAM lookup table 104 thus acts as a phase-to-amplitude converter. The phase accumulator generates a discrete time phase sequence $N_{PA}(n\delta t)$, which is then mapped to the amplitude domain using a lookup table 104 containing amplitude values for the sinusoid. Where a different waveform is desired to be created, amplitude values for the different waveform may be stored in the lookup table 104. The digitized phase mapping from the phase accumulator is used to address the ROM/RAM which contains the stored values of the desired output waveforms. The phase-to-amplitude conversion process maps the sequence of instantaneous binary phase values provided by the phase accumulator through corresponding phase values into quantized amplitude time samples of the generated waveform. If the output is to be over a usable bandwidth, the memory must also be fast. Memory is the slowest digital device in the chain (logic gates operate today at 5 GHz, while memory is about an order of magnitude slower).

To convert the phase to amplitude a converter, ideally, would take the q accumulated phase bits as the input. Because lookup tables are mostly used for phase-to-sinusoid amplitude conversion, with linearly increasing q the table size increases exponentially. Due to excessive memory requirements, it may not be practical to use the full precision of the phase accumulator to index into the sine/cosine lookup table. A quantized (or truncated) version of the phase angle therefore may be used to index into the lookup table 104 such that only the p most significant bits are used to obtain the amplitude value of the Sine wave.

A phase quantizer 122 (see FIG. 22) accepts the high-precision phase accumulator output value of q bits and generates a lower precision phase value of p bits. This value is then presented to the address port of the lookup table 104 to allow an amplitude value to be retrieved for the phase present in the register during that clock cycle.

As described above, not all of the bits recorded in the phase accumulator may be input to the sine lookup algorithm. Reducing the number of bits input to the sine lookup function is referred to herein as phase truncation. Phase truncation is an internal operation of DDSs and cannot be externally influenced. The truncation of the Least Significant Bits (LSB) is a loss of phase information and contributes errors. However, in most practical designs, the spurs caused by phase truncation error are low.

The size of the lookup table also can be reduced by taking advantage of the symmetry of the sine wave. First, there is symmetry about the x-axis, indicated by the most-significant bit (MSB) used as a sign bit. Next, there is vertical symmetry about each half sine wave, where the second MSB is used for quadrant information. Thus, due to the symmetry of the Sine wave, only one quadrant of the waveform must be stored in the lookup table 104. The 2 most significant bits from the accumulator, in this embodiment, may be used to identify the quadrant and the next m bits may be used to obtain an amplitude value from the data stored in the lookup table 104. This implementation results in a more area efficient implementation because the memory requirements are minimized: either fewer FPGA block RAM or reduced distributed memory may be implemented to access the requisite information.

Amplitude quantization occurs in the sine lookup process. The lookup takes in a fixed number of bits of phase information and converts it to the equivalent sine amplitude. Since an ideal sine representation would require an infinite number of bits for most values, the value must be truncated. Most DDSs quantize the values and output the 12 MSBs as the sine amplitude representation which is a typical value for practical high-speed DACs. Quantization beyond the value accepted by the DAC would be ignored by the DAC and, hence, is not beneficial.

If an analog output is required, the DDS presents the digital samples from the lookup table to a DAC to obtain an analog waveform with the specific frequency structure. Of course, the samples may also be used directly in the digital domain and the invention is not limited to an embodiment that implements a DAC.

The DAC converts the output values from the ROM/RAM lookup table 104 (i.e., the digital amplitude information) into an analog output $V_{out}(t)$. A conventional high speed DAC 106 may be used to convert the output values from the lookup table 104 and the invention is not limited to implementation using a particular DAC.

The output of the DAC has the desired sine wave as a major component, but also includes higher frequency image components introduced by the DAC 106 and the other components of the DDS. A Low-Pass Filter (LPF) 108 may be used to reduce these image signals to the desired level, as shown in FIG. 20.

Additional degradation of the output waveform signal may also occur due to harmonics of the frequency being generated and the clock rate of the DAC. Non-ideal behavior of the DAC will introduce distortion that shows up as harmonic spurs. Slow edge rates or delay mismatch on the signals switching the current or settling time, over/under shoot, and glitch impulses at the DAC output can lead to this harmonic distortion. When operating well below Nyquist, these harmonics appear directly in the pass band and usually can be handled with appropriate filter at the output. However, when generating frequencies that approach Nyquist, these harmonics can mix with the reference clock and can produce aliasing—spurs that fall onto or near the fundamental frequency.

The spectral quality of a DDS system is dependent upon a number of factors including the phase noise of the clock source, the number of phase bits applied to the sine lookup function (i.e., phase truncation, which is an internal operation of the DDS and cannot be externally influenced), and the number of bits output from the lookup (i.e., amplitude truncation).

The specifications of the DAC, LPF design, and circuit card design also affect the quality of the converted sine wave. The linearity and glitch energy specifications of the DAC are especially important to the generation of pure sine wave signals. Careful attention to layout of the printed circuit design is important to limiting the noise of the synthesizer. Digital switching and power supply noise should be limited from coupling with clock and analog signals.

The reference clock signal 120 input to a DDS system is a major contributor to the phase noise of the system, even though its effect is reduced by the frequency division process of the DDS. The phase noise of the DDS output will show an improvement over phase noise of the clock source itself of $$\text{Improvement in phase noise} = 20 \log \left[ \frac{f_o}{f_{out}} \right]. \quad (15)$$

The frequency accuracy of the clock is propagated through the DDS. Therefore, if the sampling frequency is 10 ppm higher than desired, it may be shown that the output frequency will also be higher by 10 ppm. Thus, the stability of the high-speed oscillator is important in determining the overall stability of the DDS. A method and apparatus for synchronizing the local reference clocks of the master and slave Digitally Controlled Frequency Selectors is described in greater detail below.

The frequencies of the discrete spurs and the amplitude of each are dependent on the ratio of the generated frequency $f_{out}$ to the clock frequency $f_o$, as well as the phase relationship of the output waveform to the sample clock. The 12-bit digitized sine output may provide a broadband signal-to-spurious ratio of 72 dB, again depending on the quality of the DAC and the LPF design, as well as the printed circuit characteristics and the phase noise of the clock frequency.

The DDS is able to generate frequencies from 0 Hz to ½ the frequency of the reference clock. However, limitations on the slope of the roll off of the LPF may reduce the practical upper limit of the output frequency to about 40% of the reference clock frequency.

Figure 22:
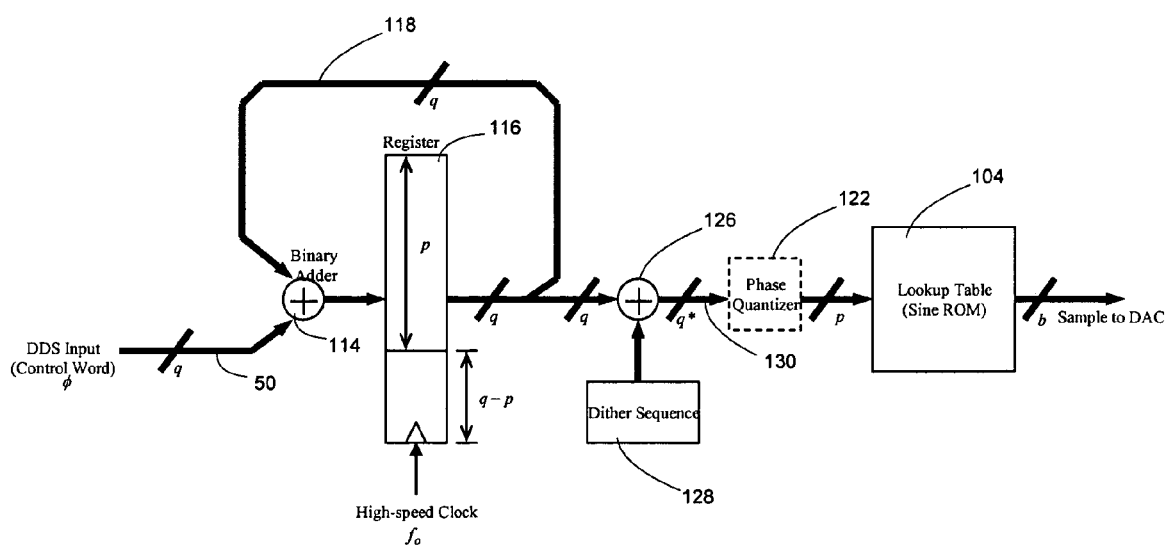
FIG. 22 is a functional block diagram illustrating synchronization of local reference clocks according to an embodiment of the invention.

Phase truncation and amplitude quantization (discussed above) results in periodic noise, which results in undesired spectral line structures. To lower the spurious levels it is possible to spread them over the spectrum. While this will reduce the levels, it also causes the noise floor to rise. One way to lower the spurious levels is to use a phase dithered DDS architecture, an example of which is shown in FIG. 22. The example shown in FIG. 22 uses first order dithering, although the invention is not limited in this manner.

As shown in FIG. 22, the input control word 50 is added to the current register value 118 in the binary adder 114 during each clock cycle. The output of the register 116 is passed to an adder 126 which receives as an input a dither sequence 128 By adding a dither sequence, the spurious levels can be suppressed by breaking up the regularity of the address error with additive randomizing signal. This randomizing sequence, called dithering, is a noise sequence, with variance approximately equal to the least significant integer bit of the phase accumulator. The q-bit dithered signal 130 is passed to a phase quantizer 122 which extracts the p most significant bits and passes those bits to the lookup table 104 which uses these bits to determine a sine value as described in greater detail above.

One advantage of using a dithered DDS such as the one shown in FIG. 22 is that, in a dithered DDS, the spectral line structure present in a phase truncation design is removed and the out-of-band signal is significantly whitened. This white broadband noise floor is more desirable than the line structured spectrum. In digital communication receivers that use a DDS for generating mixing signals for performing channelization functions, the spurs in a phase truncation DDS can act as low-level mixing tones and cause undesirable spectral contamination of the desired channel. The preferred implementation, therefore, is to use a dithered DDS architecture, although the invention is not limited to use of this particular preferred embodiment.

Controlling the DDS

The DDS is basically a digital frequency divider the incremental resolution of which is determined by the frequency of the reference clock divided by the $2^q$ number of bits in the tuning word. The phase accumulator is a variable-modulus counter that increments the number stored in it each time it receives a clock pulse. When the counter overflows it wraps around, making the phase accumulator's output contiguous. The frequency tuning word sets the modulus of the counter that effectively determines the size of the phase increment (φ) that gets added to the value in the phase accumulator during each pulse of the reference clock. The larger the added increment, the faster the accumulator overflows, which results in a higher output frequency.

The output frequency $f_{out}$ of the DDS waveform is a function of the system clock frequency $f_o$, the number of bits q in the phase accumulator and the phase increment value φ. The phase increment value required to generate an output frequency $f_{out}$ Hz is $$\phi = \frac{2^q f_{out}}{f_o}. \quad (16)$$

The phase increment $\phi$ is an unsigned value and defines the DDS output frequency.

Assume that the DDS is operating with a control input $\phi_{nom}$ which corresponds to the nominal frequency $f_{DDS}=f_{nom}$. Adding a quantity $-\Delta\phi$ to $\phi_{nom}$ (i.e., $\phi_{DCO}=\phi_{nom}-\Delta\phi$) results in a decrease in the output frequency, $f_{DDS}=f_{nom}-\Delta f$, whereas adding a quantity $+\Delta\phi$ to $\phi_{nom}$ (i.e., $\phi_{DDS}=\phi_{nom}+\Delta\phi$) results in an increase in the output frequency, $f_{DDS}=f_{nom}+\Delta f$. Thus, by appropriately controlling the quantity $\Delta\phi$ added to $\phi_{nom}$, the output frequency of the DCO $f_{DDS}$ can be controlled accordingly. The size of the phase increment determines the actual output frequency and the fixed binary width q of the accumulator (which overflows) determines the minimum frequency resolution of the DDS. When the DDS is used as a DCFS in a master clock PLL, the value $\Delta\phi$ may be determined from the error signal 56 generated from the filtered phase frequency detector output. Since the details of obtaining an error signal $\Delta\phi$ are set forth in particularity above, a repeated exposition of this topic has been omitted to avoid obscuring the invention.

A DDS may be implemented as a single chip with high clock rates (greater 150 MHz). These devices are competitive in price and power when compared to analog PLLs, while offering high performance, and ease of use and assembly. A DDS can also provide high accuracy and versatile waveform generation. The output frequency of a DDS can be precisely controlled from a digital controller. The frequency can be changed rapidly, each time maintaining phase continuity. A DDS allows frequency resolution control on the order of milli-hertz step size and can likewise allow milli-hertz or even nano-hertz of phase resolution control. In addition, a DDS imposes no settling time constraints for frequency changes other than what is required for digital control. This results in extremely fast frequency switching speeds, on the order of nanoseconds or a few microseconds. In comparison, an analog PLL has a frequency resolution in the 100s of Hz and settling time is a function of the loop filter characteristics, typically about 1 ms. Whereby analog PLL techniques employ feedback and filtering of error signals impeding the time required to change frequencies, a DDS is only constrained by the digital interface control and the settling time requirements of the DAC. DDSs switch frequencies at rates on the order of nanoseconds or a few microseconds, an improvement of at least one or two orders of magnitude faster than conventional PLL switching speeds.

In a DDS, frequency changes are automatically completed in a phase-continuous fashion—a change to a new frequency continues in-phase from the last point in the previous frequency. Since the signal being generated is in the digital domain, it can be manipulated with exceptional accuracy. Optionally, a microprocessor-controlled system can be implemented to store open loop compensation data vs. frequency for a particular device or system parameter. The microprocessor can then simply control the DDS to dynamically correct the frequency as needed. With a suitable frequency detector in a receiver system, a closed-loop system can easily be constructed.

While the DDS offers many design benefits, there are a few drawbacks that should be considered as well. The limitations imposed by the digital sampling process and the digital-to-analog reconstruction affect three primary areas of performance: maximum frequency limitations, spurious signals at output; and power consumption. Additional details associated with DDS design are set forth in Provisional U.S. Patent Application No. 60/674,231, the content of which is hereby incorporated herein by reference. The invention is not limited to the embodiment(s) disclosed in this provisional application, however, as other DDS designs may be utilized as well.

Part II—Second Level Control

In the clock synchronization scheme described above, the master and slave clocks are implemented as Digitally Controlled Frequency Selectors (DCFS), each of which includes a local high frequency oscillator. For example, in the embodiment in which the DCFS is implemented as a Digitally Controlled Oscillator (DCO), illustrated for example in FIGS. 3, 5, and 7, the DCO uses a fixed high frequency oscillator 66 to output pulses 68, the frequency of which are used to count up or down to a control word. By setting the control word, the output frequency from the DCO may be adjusted. Similarly, in the embodiment in which the DCFS is implemented as a Direct Digital Synthesize (DDS), illustrated for example FIGS. 4 and 20, a fixed high frequency oscillator input 120 determines how often the value of the register 116 in the phase accumulator 102 will be incremented, and the control word determines the size of the increment. The combination of increment size and increment frequency specifies the output frequency of the DDS.

In each of these embodiments, the local oscillator frequency directly affects the output frequency of the DCFS. For example, a DCO has an inherent stability equal to that of the input high-speed oscillator. If the high-speed oscillator has a frequency range of $f_o \pm \Delta f_o$, and normalized error $\pm \Delta f_o/f_o$ (which is usually expressed in parts per million, (ppm)), then for a DCO input word $N_{nom}$, the output signal will have a corresponding frequency range $$\hat{f}_s = \frac{f_o \pm \Delta f_o}{N_{nom}} = f_{nom} \pm \frac{\Delta f_o}{N_{nom}}. \quad (17)$$

The error range of the output frequency is scaled accordingly by a factor of $N_{DCO}$ and is equal to $$\Delta \hat{f}_s = \pm \frac{\Delta f_o}{N_{nom}}, \quad (18)$$

but the normalized error range stays the same as that of the high speed oscillator, i.e., $$\frac{\Delta \hat{f}_s}{f_{nom}} = \pm \frac{\Delta f_o}{N_{nom} f_{nom}} = \pm \frac{\Delta f_o}{f_o}. \quad (19)$$

Thus, the stability of the high-speed oscillator is important in determining the overall stability of the DCO.

A DDS similarly is dependent on the stability of the local high-speed oscillator. Specifically, since frequency accuracy of the clock is propagated through the DDS, if the sampling frequency of the DDS is 10 ppm higher than desired (because the input reference clock signal is running 10 ppm too fast) the output frequency will also be higher by 10 ppm. Mathematically, this may be explained as follows. If the high-speed oscillator has a frequency range of $f_o \pm \Delta f_o$, and normalized error $\pm \Delta f_o / f_o$, then for a DDS input word $\phi_{nom}$ (corresponding to the nominal out frequency $f_{nom}$), the output clock will have a corresponding frequency range $$f_{out} = \frac{(f_o \pm \Delta f_o) \phi_{nom}}{2^q} = f_{nom} \pm \frac{\Delta f_o \phi_{nom}}{2^q}. \quad (20)$$

The error range of the output frequency is scaled accordingly and is equal to $$\Delta f_{out} = \pm \frac{\Delta f_o \phi_{nom}}{2^q}, \quad (21)$$

but the normalized error range stays the same as that of the high speed oscillator, i.e., $$\frac{\Delta f_{out}}{f_{nom}} = \pm \frac{\Delta f_o \phi_{nom}}{2^q f_{nom}} = \pm \frac{\Delta f_o}{f_o}. \quad (22)$$

Thus, the stability of the high-speed oscillator is also important in determining the overall stability of a DDS.

Since the slave and master DCFSs each implement their own local high frequency oscillator, any frequency variation between the high frequency oscillators will result in frequency discrepancies between the master and slave clock outputs. Thus, the inherent clock stability at a master (or slave) clock is dependent on the stability of the local high speed oscillator at that clock. Additionally, since the master clock is implemented as a PLL, any instability at the master will result in the generation of a control word that compensates for the local oscillator drift. This, accordingly, will manifest itself in the slave clock since the control word passed to the slave clock will reflect the master local oscillator drift. Accordingly, the slave clocks will experience drift not only from their own local oscillator, but also that of the master clock local oscillator.

To minimize the amount of drift experienced at the slaves, and for the clock synchronization scheme to be reasonably stable and accurate, DCFSs using free running oscillators would require fairly stable high-speed oscillators. However, even if all of the local oscillators are implemented to be highly stable, the fact that the local oscillators are free-running and are allowed to operate independently ultimately may cause long term drift to occur between the Master and slave DCFSs. According to an embodiment of the invention, operation of the local oscillator at the slave clock may be synchronized with operation of the local oscillator at the master clock, to thereby provide a second level of control to occur that will allow greater synchronization between the clocks to be achieved. For example, a stable local oscillator may be implemented at the master clock and frequency controlled oscillators may be used to implement the local high frequency oscillators at the slave clocks. Operation of the local oscillator of the master clock DCFS may then be monitored, and information associated with its operation may be transmitted to the slave clocks to allow the local oscillators at the slave clocks to mimic the behavior of the master clock local oscillator.

Time stamps may be used, for example, to transmit local oscillator frequency information from the master clock to the slave clocks. In the timestamp-based technique for clock synchronization, a transmitter periodically sends explicit time indications or timestamps to a receiver to enable the receiver to synchronize its local clock to the transmitter's clock. For example, as shown in FIG. 23 and as described in greater detail below, the pulses from the local high-speed oscillator in the master DCFS may be counted by a pulse counter by causing the content of the counter to be incremented by a fixed amount each time the local high speed oscillator issues a pulse. The value of the pulse counter may be periodically sampled and transmitted via unicast, multicast, or broadcast, to the slave clocks in the form of timestamps. When the slave clocks receive the timestamps, they can use the timestamps to verify that their local oscillators have issued the same number of pulses in the same period of time. In this way, the slave local oscillators may lock onto the frequency of the master local oscillator to replicate the oscillating frequency of the master local oscillator. The invention is not limited in this manner, however, as other ways of synchronizing the slave local oscillators with the master local oscillator may be used as well.

The use of timestamps to synchronize two signals is described in greater detail in U.S. patent application Ser. No. 10/076,415, entitled Technique For Synchronizing Clocks In A Network, the content of which is hereby incorporated by reference. In general, timestamps are a construct that allows the number of clock cycles that have occurred at a particular time to be captured and then replicated at another clock source so that the second clock source is able to recreate the operating frequency of the first clock source. If the two clocks are not generating the same number of clock cycles in a given period, the frequency of the tracking clock may be adjusted to more closely approximate the frequency of the master clock.

For example, let the value T(n) denote the time base (e.g., number of clock ticks) of the transmitter at a particular time n, and the value R(n) represent the time base (e.g. number of clock ticks) of the receiver at time n. In the embodiment shown in FIGS. 23 and 24, the transmitter would be the local oscillator 132 of the master DCFS and the receiver would be the local oscillator 138 of the slave DCFS. Functions T(n), R(n), correspond to the timestamps of the two clocks 132, 138, at discrete time instants n, n=0,1,2, . . . .

The timestamp difference between the nth and (n−1) th timestamp generated at the transmitter 132 is defined as $\Delta T(n) = T(n) - T(n-1)$. Similarly, the timestamp difference between the nth and (n−1)th timestamp as measured by the receiver clock is defined as $\Delta R(n) = R(n) - R(n-1)$.

When timestamps are transmitted over the packet network, they will arrive at the receiver with variable delay. If d(n) and d(n−1) denote the delay experienced by the nth and (n−1) th timestamp at the receiver, respectively, then the jitter induced by the network is given as $j(n) = d(n) - d(n-1)$. Accordingly, the timestamp difference measured by the receiver includes both the timestamp difference introduced by the transmitter $\Delta T(n)$ and the jitter j(n) experienced as the timestamp was transmitted over the network, that is, $\Delta R(n) = \Delta T(n) + j(n)$.

Ideally, the jitter j(n) should not affect clock recovery at the receiver. To filter out the jitter, the receiver clock frequency $f_s = 1/\tau_s$ may be controlled such that the receiver clock measurements $\Delta R(n)$ are equal to the transmitter clock timestamp differences $\Delta T(n)$. To adjust the receiver clock, an error signal may be formed from the difference between $\Delta T(n)$ and $\Delta R(n)$: $e(n) = \Delta T(n) - \Delta R(n)$. Over time, if the transmitter and receiver are operating at the same frequency, the error signal should tend toward zero.

The computed error signal may therefore be filtered and used as feedback in a PLL to adjust the operating frequency of the receiver clock. Specifically, the error signal may be input to a loop filter of a PLL whose output then controls the frequency $\hat{f}_s=1/\hat{\tau}_s$ of the oscillator of the receiver clock, where $K_o$ is the gain of the VCO. The function of the PLL is to control the receiver clock frequency $\hat{f}_s$ such that the error e goes to zero at which point the receiver frequency equals the transmitter frequency $f_s$. The loop filter is a simple low-pass filter and may take the form, for example, of the loop filter shown in FIG. 25, although other filters may be used as well.

FIG. 23 illustrates an embodiment of the invention in which timestamps are used to convey the state of the master local high-speed oscillator to the slave clocks. The timestamps in this instance are not used to convey the output of the master clock, but rather are used to convey internal state information associated with a component of the master clock. Accordingly, the timestamps in this instance do not carry end state information but rather are configured to carry intermediate state information that may be used to synchronized an internal parameter of the master and slave clocks rather than the final output of the master and slave clocks.

In the embodiment shown in FIG. 23, the master clock 16 includes a Digitally Controlled Frequency Selector (DCFS) 54 configured to digitally create a synthesized clock signal 44. The master clock 16 is formed as a Phase-Locked Loop (PLL) so that the synthesized clock signal 44 from the DCFS is able to lock onto an input reference frequency 24. The DCFS has a local oscillator 132 or is connected to a local oscillator source 132 that could be free-running and independent of the reference frequency 24. The output of the local oscillator is monitored, for example by the timestamp counter 136, so that the state of the local oscillator 132 may be transmitted to the slave clocks 18 and replicated at the slave clocks 18.

In the example shown in FIG. 23, the master clock is implemented to provide information to the slave clocks that will allow both first and second level control to occur to thereby enable the slave clocks to more accurately recreate the state of the master clock. As shown in FIG. 23, the master clock is constructed in much the same way as the master clock described above. In particular, the master clock is configured as a PLL that is designed to lock the master output 44 with the PLL reference frequency 24. To do this, the master clock uses a PFD 42 to generate an error signal 46 representative of the difference between the master output 44 and reference signal 24. The error signal is filtered in loop filter 34 to generate a filtered error signal 56. The filtered error signal is combined with a nominal control word 48 at a combiner 60, to form a DCFS input signal 50. The DCFS 54 (which may be a DCO, DDS, or another type of digital circuit) uses the DCFS input signal 50 to generate the synthesized clock output signal 44. As described above, first level control over the slave DCFS may be achieved by transmitting either the filtered error signal 56 or the DCFS input signal 50 to the slave clocks to allow the slave clocks to replicate the master output.

As shown in FIG. 23, the DCFS implements a local oscillator 132 or, alternatively, is connected to a local oscillator 132, to provide the DCFS 54 with a local clock signal 134. According to an embodiment of the invention, the state of the local oscillator 132 may be monitored, such as through the use of a counter 136 connected to the output clock signal 134, to allow the state of the local oscillator to be replicated at the slave clocks. In this embodiment, the frequency of the local oscillator is not output as the synthesized clock signal 44, but variations in the local oscillator frequency may alter the operation of the master DCFS, which will then be compensated for in the control loop by altering the DCFS input. Since the identical variations in the local oscillator frequency would not be expected to occur in the slave clocks, the modification of the DCFS input 50 to accommodate the frequency fluctuations in the local oscillator output signal 134 will be reflected in the slave clocks as frequency fluctuations. To alleviate this, the counter 136 conveys the state of the local oscillator (for example using timestamps) so that the slave clocks may replicate both the DCFS input and the internal operating state (e.g. local oscillator frequency) of the master DCFS.

FIG. 24 illustrates a slave clock 18 in which a DCFS 22 is used to generate a synthesized clock signal 44 (slave output 44). Ideally, the slave output signal 44 should be the same as the synthesized clock signal 44. Accordingly, the same reference numeral has been used to designate each output. Minor variations between these two signals may occur without departing from the scope of the invention.

The slave clock, as shown in FIG. 24, is implemented as a DCFS of the same type as the master DCFS, but is not implemented to lock onto a reference frequency. Rather, using the procedure described in greater detail above, the output frequency of the slave DCFS is determined by the periodic transmission of control words from the master clock to the slave clock so that the operating frequency output by the slave DCFS may replicate that of the master DCFS. Additionally, the local oscillator implemented by the slave clock, according to an embodiment of the invention, is implemented as a phase locked loop including a frequency controlled oscillator. The output of the master DCFS local oscillator such as in the form of timestamp is used as an input to the PLL associated with the slave DCFS local oscillator to allow the local oscillator state of the slave DCFS local oscillator to track the state of the master DCFS local oscillator. Synchronizing this internal component of the master DCFS and slave DCFS allows a second level of control to be exerted by the master over the slave clocks.

The DCFS 22 forming slave clock 18 has a local oscillator 138 configured to generate a local oscillator clock signal 142. Where the DCFS is implemented as a DCO, as shown in FIGS. 5 and 7, the local clock signal 142 is also designated as signal 68. Where the DCFS is implemented as a DDS, as shown in FIG. 20, the local clock signal has also been designated as signal 120. For convenience, the local clock reference signal generated by the local oscillator 138 will be referred to in this section as signal 142. Operation of the local oscillator 138 is controlled through the use of a phase locked loop 146 to synchronize output 142 of the local oscillator with operation of the local oscillator 132 in the master clock.

Figure 25:
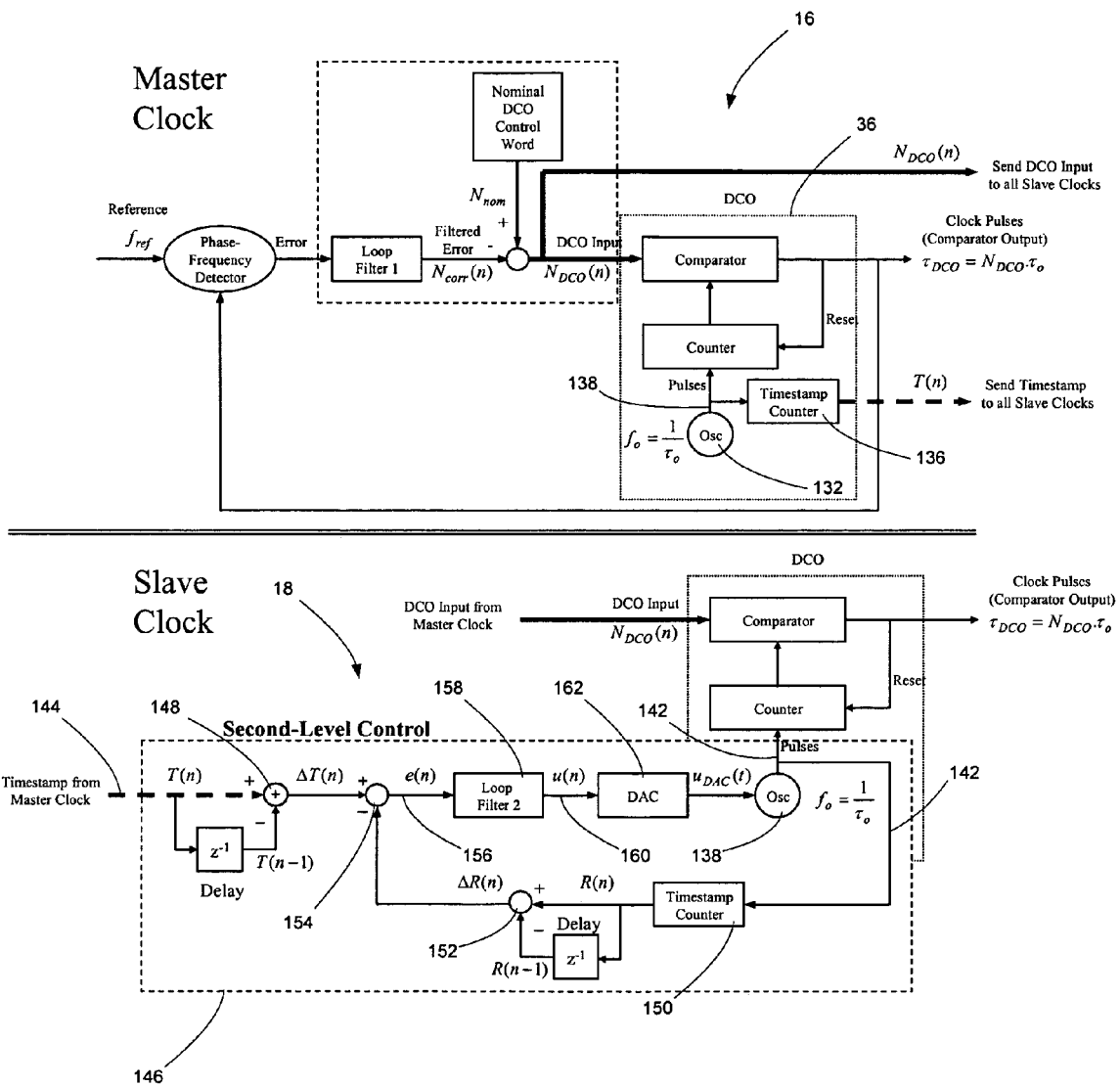
FIG. 25 is a functional block diagram of a clock synchronization scheme implementing second level control according to an embodiment of the invention.

FIG. 25 illustrates an example of a master and a slave clock, in greater detail, in which the DCFS is implemented as a DCO. As discussed above, the master clock implements a timestamp counter 136 to generate timestamps 144 from the local oscillator 132, to allow the state of the local oscillator 132 to be tracked and replicated at the slave clocks 18. As shown in FIG. 25, timestamps 144 are input to a second level control 146 of the slave clock 18 which, in this instance, is implemented as a PLL. Other ways of controlling the frequency of the local oscillator 138 may be used as well and the invention is not limited to the use of a PLL.

In the second level control, the input timestamp T(n) is compared with a delayed timestamp T(n−1) at a first summing junction 148 to calculate the transmitter clock timestamp difference ΔT(n)=T(n)−T(n−1). At the same time, the oscillator is outputting a signal 142 that is used to run the DCFS which, in the embodiment shown in FIG. 25 is a DCO. The DCFS may also be implemented as a DDS or another digital circuit. To enable the output to be feedback controlled via the PLL, the output clock signal 142 is input to a slave frequency timestamp counter 150. The slave frequency timestamp counter 150 generates a timestamp R(n) which is compared at a second summing junction 152 with an earlier timestamp R(n−1) from the slave frequency timestamp counter 150 to generate the receiver clock timestamp difference $\Delta R(n)=R(n)-R(n-1)$.

The transmitter clock timestamp difference and receiver clock timestamp difference are compared at a third summing junction 154 to generate an error signal $e(n)=\Delta T(n)-\Delta R(n)$ 156. The error signal 156 is filtered using loop filter 158 to form a filtered error signal u(n) 160. The filtered error signal, over time, should tend toward zero to allow the jitter to be filtered out, so that the reference frequency 142 of the slave local oscillator is able to track the reference frequency 134 of the master local oscillator 132.

The loop filter may be formed to be similar to the loop filter shown in FIG. 19 or as described in greater detail in U.S. patent application Ser. No. 10/076,415. The filtered error signal is converted to an analog signal via a digital to analog converter (DAC) 162. The output from the DAC $u_{DAC}(t)$ is used to control the operating frequency of the oscillator 138. The oscillator may be a voltage controlled oscillator in which case the output from the DAC would be a variable voltage, or the oscillator may be a current controlled oscillator in which case the output of the DAC would be a variable current. The invention is not limited in this manner, however, as other types of controllable oscillators may be used as well.

Figure 26:
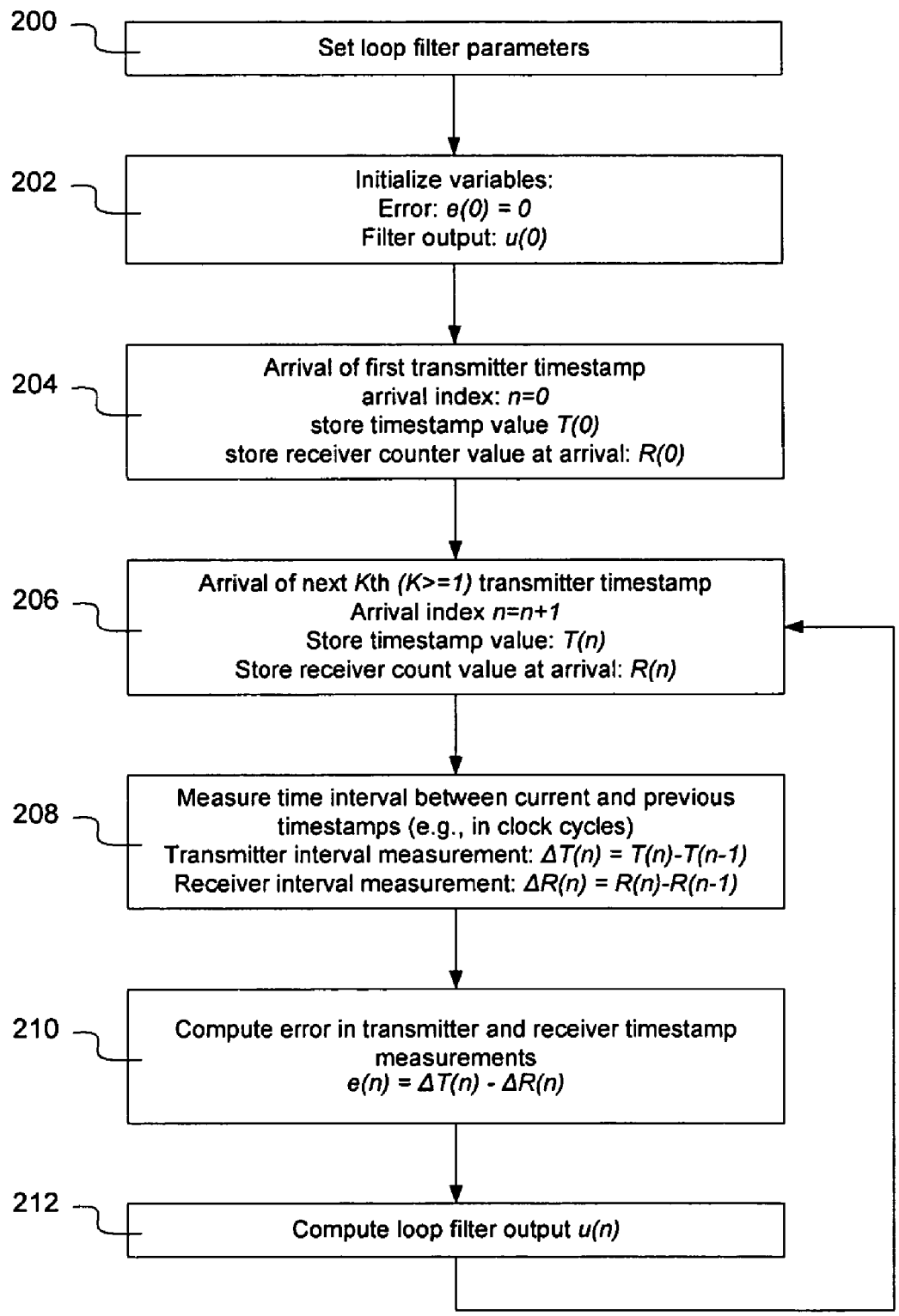
FIG. 26 is a flowchart illustrating a process that will allow local oscillators forming the DCFS of the master and slave clocks to be synchronized according to an embodiment of the invention.

FIG. 26 illustrates a process of controlling a local oscillator at a slave clock to cause the slave clock local oscillator 138 to assume the same internal state as the local oscillator of the master clock. As shown in FIG. 26, initially when the slave clock is started, insufficient information will be available to allow the slave clock to use feedback to control its operating frequency 144. In this instance, the initial loop filter parameters will be set (200) and the initial error e(0) and offset current/voltage u(0) will be set as well to allow the slave clock local oscillator 138 to operate in start-up mode (202).

When the first transmitter timestamp arrives, it will be stored and the receiver counter value will be stored (204). When a subsequent timestamp arrives from the transmitter (206), and for each subsequent timestamp that arrives from the transmitter, the arrival index n will be incremented and the timestamp value of the transmitter and receiver timestamps will be stored. The transmitter clock timestamp difference $\Delta T(n)=T(n)-T(n-1)$ and receiver clock timestamp difference $\Delta R(n)=R(n)-R(n-1)$ will then be calculated (208) to allow an error signal to be generated. Knowing the two timestamp differences allows the error signal $e(n)=\Delta T(n)-\Delta R(n)$ to be calculated (210), which may then be filtered by the loop filter to calculate the loop filter output (212).

Using timestamps to allow the slave local oscillators to synchronize with operation of the master local oscillators allows the stability of the high-speed oscillators to be increased by locking the slave clock's high-speed oscillator to the master's high-speed oscillator. Transmission of the control word to cause overall synchronization of the DCOs or DDSs thus provides a first level control, while allowing synchronization of the local oscillators provides a second level control that prevents frequency differences in the local oscillators from affecting the transmission scheme.

Although an embodiment has been described in which timestamps were generated at the master clock and transmitted to the slave clocks, alternatively the slave clocks may generate timestamps from their local oscillators and transmit the timestamps to the master clock. The master clock may use the values from the local oscillators, in this embodiment, to generate slave specific DCFS control words to compensate for the local oscillator drift and unicast those slave specific DCFS control words to the slave clocks. Performing local oscillator processing at the master clock allows the slave clocks to be kept very simple, which may be advantageous in particular environments. Requiring the master clock to process timestamps from each of the slaves, however, will require the master clock to be implemented with additional processing capacity. The invention is not limited, therefore, to an embodiment as shown in the several figures as other ways of synchronizing the state of an internal reference frequency may be implemented as well.

The circuits described herein that may be used to form master and slave clocks may be implemented using discrete components, integrated circuitry, or using a combination of hardware and control logic implemented as a set of program instructions that are stored in a computer readable memory within the network element and executed on a microprocessor. However, it will be apparent to a skilled artisan that all logic described herein can be embodied using discrete components, integrated circuitry, programmable logic used in conjunction with a programmable logic device such as a Field Programmable Gate Array (FPGA) or microprocessor, or any other device including any combination thereof. Programmable logic can be fixed temporarily or permanently in a tangible medium such as a read-only memory chip, a computer memory, a disk, or other storage medium. Programmable logic can also be fixed in a computer data signal embodied in a carrier wave, allowing the programmable logic to be transmitted over an interface such as a computer bus or communication network. All such embodiments are intended to fall within the scope of the present invention.

Although the invention has been described in the context of clock distribution over an asynchronous network the invention is not limited in this manner. For example, embodiments of the invention may also be used as a timing distribution technique for a packet backplane interconnect in a packet switch, router, or TDM switch, as a TDM backplane extension, for example to extend the reach of a TDM bus over a longer distance, and as a TDM backplane expansion, for example to scale up a TDM backplane to handle more cards and devices.

It should be understood that all functional statements made herein describing the functions to be performed by the methods of the invention may be performed by software programs implemented utilizing subroutines and other programming techniques known to those of ordinary skill in the art. It also should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A slave clock, comprising:
   a digitally controlled frequency selector configured to generate a synthesized output signal the frequency of which is selected by the input of a control word; and
   a frequency adjustable local oscillator configured to input a reference signal to the digitally controlled frequency selector;
   wherein the digitally controlled frequency selector is a digitally controlled oscillator comprising a counter and a comparator, and wherein the control word is used to set at least one of an initial value of the counter and a value of the comparator;

wherein the frequency adjustable local oscillator is configured to output a signal, a frequency of which, is used to determine the frequency with which the counter is adjusted; and wherein the slave clock comprises means to adjust the frequency of the frequency adjustable local oscillator to approximate a frequency of a local oscillator at a master clock.

2. A slave clock, comprising:

a digitally controlled frequency selector configured to generate a synthesized output signal the frequency of which is selected by the input of a control word; and a frequency adjustable local oscillator configured to input a reference signal to the digitally controlled frequency selector;

a timestamp generator configured to generate slave timestamps from the input of the digitally controlled frequency selector; and circuitry configured to receive master timestamps associated with operation of an oscillator at a master clock and to compare differences in master timestamps with differences in slave timestamps;

wherein the digitally controlled frequency selector is a digitally controlled oscillator comprising a counter and a comparator, and wherein the control word is used to set at least one of an initial value of the counter and a value of the comparator.

3. A slave clock, comprising:

a digitally controlled frequency selector configured to generate a synthesized output signal the frequency of which is selected by the input of a control word;

a frequency adjustable local oscillator configured to input a reference signal to the digitally controlled frequency selector;

a timestamp generator configured to generate slave timestamps from the input to the digitally controlled frequency selector; and circuitry configured to receive master timestamps associated with operation of an oscillator at a master clock and to compare differences in master timestamps with differences in slave timestamps;

wherein the digitally controlled frequency selector is a direct digital synthesizer; and wherein the direct digital synthesizer comprises a phase accumulator configured to accumulate an amount of phase set by the control word during each period of the input a reference signal.

4. A master clock, comprising:

a phase locked loop configured to synchronize a synthesized output signal generated by a digitally controlled frequency selector with a reference signal;

a control word generator configured to periodically collect a control word being used by the digitally controlled frequency selector to generate the synthesized output signal and to pass the collected control word to at least one slave clock; and a timestamp generator configured to collect information from a master local oscillator associated with the digitally controlled frequency selector and to pass the collected information to the at least one slave clock.

5. The master clock of claim 4, wherein the timestamp generator is a counter configured to count pulses of the master local oscillator.

6. The master clock of claim 5, wherein the digitally controlled frequency selector is a digitally controlled oscillator comprising the master local oscillator, a counter and a comparator, the master local oscillator producing a clock signal that is used to control a frequency with which the counter is incremented.

7. The master clock of claim 6, wherein the control word generator is configured to collect information associated with at least one of a value of an initial value of the counter or a value of the comparator.

8. The master clock of claim 5, wherein the digitally controlled frequency selector is a direct digital synthesizer comprising the master local oscillator, a phase accumulator, and a phase to amplitude converter, and wherein the master local oscillator is configured to produce a clock signal that is used to control a frequency when a phase increment is added to the phase accumulator.

9. The master clock of claim 8, wherein the control word generator is configured to collect information associated with the phase increment.

* * * * *

UNITED STATES PATENT AND TRADEMARK OFFICE
CERTIFICATE OF CORRECTION

PATENT NO. : 7,590,210 B2
APPLICATION NO. : 11/172100
DATED : September 15, 2009
INVENTOR(S) : Aweya et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1008 days.

Signed and Sealed this

Twenty-first Day of September, 2010

David J. Kappos
*Director of the United States Patent and Trademark Office*